United States Patent [19]

Hagner

[11] Patent Number: 5,055,637
[45] Date of Patent: Oct. 8, 1991

[54] CIRCUIT BOARDS WITH RECESSED TRACES

[76] Inventor: George R. Hagner, c/o M. Allison 240 Orange Ave., Coronads, Calif. 92118

[21] Appl. No.: 434,427

[22] Filed: Nov. 13, 1989

Related U.S. Application Data

[63] Continuation-in-part of Ser. No. 346,220, May 2, 1989, Pat. No. 4,985,601.

[51] Int. Cl.$^5$ .............................................. H05K 1/00
[52] U.S. Cl. .................................... 174/260; 174/261; 174/262; 361/401
[58] Field of Search .................. 174/260, 261, 262; 361/401

[56] References Cited

U.S. PATENT DOCUMENTS

| | | | |
|---|---|---|---|
| 2,600,343 | 6/1952 | Tuttle | 361/397 X |
| 2,695,351 | 11/1954 | Beck | 174/259 X |
| 2,848,359 | 8/1958 | Talmey | 174/257 X |
| 2,874,085 | 2/1959 | Brietzke | 156/150 |
| 2,981,868 | 4/1961 | Severson | 361/401 |
| 3,710,196 | 1/1973 | Fifield | 174/261 X |
| 3,729,819 | 5/1973 | Horie | 174/254 X |
| 3,934,336 | 1/1976 | Morse | 174/261 X |
| 4,080,513 | 3/1978 | Cuneo et al. | 174/256 X |
| 4,345,300 | 8/1982 | Stuckey | 361/401 X |
| 4,363,930 | 12/1982 | Hoffman | 174/255 |
| 4,374,457 | 2/1983 | Wiech, Jr. | 361/401 X |
| 4,604,678 | 8/1986 | Hagner | 361/401 |
| 4,614,837 | 9/1986 | Kane et al. | 174/257 |
| 4,630,096 | 12/1986 | Drye et al. | 357/81 |
| 4,635,093 | 1/1987 | Ross | 174/260 X |
| 4,707,394 | 11/1987 | Chant | 174/257 X |
| 4,758,459 | 7/1988 | Mehta | 174/255 X |
| 4,766,268 | 8/1988 | Uggowitzer | 174/256 |
| 4,775,611 | 10/1988 | Sullivan | 174/250 X |
| 4,825,539 | 5/1989 | Nagashima et al. | 174/250 X |
| 4,841,099 | 6/1989 | Epstein et al. | 174/258 |
| 4,851,613 | 7/1989 | Jacques | 174/254 |
| 4,985,600 | 1/1991 | Heerman | 174/261 |
| 4,985,601 | 1/1991 | Hagner | 174/262 |

FOREIGN PATENT DOCUMENTS 3305952 8/1984 Fed. Rep. of Germany .
2174847 11/1986 United Kingdom .

Primary Examiner—Morris H. Nimmo
Attorney, Agent, or Firm—Jerry M. Keys; David L. Mossman

[57] ABSTRACT

Circuit boards with imbedded traces, which may form grooves or trenches are provided. The traces may be at least partially filled with a reflowable conductive material such as solder. The grooves may be selectively furnished with solder while other regions may be empty or void of solder. In assembling electronic components, with or without extended leads, such as surface mount integrated circuits or chips, to the solder core circuit boards, the leads may be placed within the regions of the grooves without solder (contact regions) and then the circuit board may be heated selectively or as a whole to reflow the solder to the bonding or contacting regions to bond the traces to the leads upon cooling. Circuit boards having surface mount devices on both sides may be formed in this manner. Further, tape automated bonded or TAB mounted devices may be directly placed into and bonded to the traces or solder core circuit boards with minimum exposure of the excised TAB leads prior to assembly. In one form, the grooves are plated with copper before they are filled with solder. Alternatively, the solder may be present only in cavities or pockets next to the contact regions where the component lead will connect with the conductive material pattern.

19 Claims, 13 Drawing Sheets

CIRCUIT BOARDS WITH RECESSED TRACES

CROSS-REFERENCE TO RELATED APPLICATION

This application is a continuation-in-part patent application from U.S. patent application Ser. No. 07/346,220 filed on May 2, 1989, entitled "Circuit Boards with Recessed Traces" now U.S. Pat. No. 4,985,601.

FIELD OF THE INVENTION

The invention relates to circuit boards for the mounting of electronic components, and more particularly relates, in one aspect, to high density circuit boards having structures thereon, such as embedded or groove-type traces, to assist in the mounting of the electronic components.

BACKGROUND OF THE INVENTION

In the building of electronic equipment, it is well known to assemble electronic components onto printed circuit boards which are in turn connected to other portions of the equipment. Conventional printed circuit boards (PCBs) have a dielectric or insulative board upon which traces of a conductive material such as copper are placed, such as by printing, coating and etching or other technique. The traces end at contact points, sometimes called pads or lands, for connection to the various electronic components. Traditionally, the lands or pads, and the insulative substrate beneath them, would be pierced by a hole through which a lead on the electronic component would pass.

In the assembly of such conventional boards, the electronic components would be placed upon the PCB with their leads through the holes in the contact points and soldered in place by conventional means, such as wave-soldering as described in U.S. Pat. Nos. 4,390,120 and 4,360,144, for example. However, in the effort to make electronic equipment and their constituent parts ever smaller, techniques have been devised for reducing the size of the PCB. For example, the holes piercing the lands or pads have been eliminated in favor of surface mounting the components on the PCB. The removal of the holes permits the contact pads to be smaller and allows the traces to be closer together, thereby permitting the size of the PCB to be reduced. The electronic components themselves now have lead shapes, such as gull-wing, butt-leads or J-leads, that allow them to be mounted directly onto the PCB surface. Surface mounting has the additional advantage of permitting components to be mounted on both sides of a PCB having conductive traces on either side.

A disadvantage to surface mounting is that it greatly reduces the contact surface between the component leads and the bonding pad thereby often reducing the physical strength of the bond which may adversely affect the circuit integrity. This reduced contact area also complicates the assembly process by making it more difficult to deliver solder to the bonding site by the conventional techniques. Standard printed wiring boards (PWBs) require wave-soldering for through-hole technology employing mainly "leaded" components. For the surface mounting of so-called "leadless" components, solder paste must be coated or screened on followed by a reflow step. Mixed technology boards, now the most common, require both solder processes. Often more than two soldering cycles are required and more than two types of solder with different melting temperatures are used. And although mounting components on both sides of the PCB potentially doubles the useful space of the PCB, it has proven difficult to mount components on the second side of the board without loosening the components already mounted to the first side. Mounting components on both sides of the board more than doubles the problems involved and steps required.

A number of documents have been published detailing improvements in PCBs. For example, U.S. Pat. No. 2,600,343 teaches a photolithographic technique for patterning conductive traces on a substrate, by providing a tough gelatino-silver-halide stencil on the substrate through which the conductive pattern is electroplated or coated. The pattern may be optionally covered by a protective, cast insulation layer. Similarly, U.S. Pat. No. 2,695,351 uses a lacquer or "stop-off" material as an etch mask to protect insulative areas that are intended to remain. In this patent, the areas of the contact points are not etched at all, whereas the traces between the contact points are partially etched. The partial etching permits the traces to be protected by a separate thermoplastic sheet. This patent contemplates that electronic components would be mounted in through-holes in the PCB.

U.S. Pat. No. 2,848,359 also contemplates a printed circuit using the traditional through-holes for interconnection. Here, a thermoset mask is formed on a substrate having the interconnect holes in place and the exposed portions of the substrate, including the holes, are plated with a conductive material. U.S. Pat. No. 2,874,085 describes a process for forming PCBs by electroplating a circuit through a varnish mask upon a base plate. The base plate is then used as a tool to place the circuit flush in the surface of a plastic sheet, with or without the varnish mask also in place, and the base plate is removed to repeat the process. A disadvantage of this technique is that the pattern must be reversed from that desired since it is flipped and inverted prior to imbedding in the plastic sheet.

Another technique involving the transfer of conductive traces to a substrate is described in U.S. Pat. No. 3,729,819. However, in this case the traces are placed on the surface of the substrate using a base layer of paper or the like, and are not imbedded within the substrate. An adhesive is used to keep the circuit in place. Additionally, the pattern is not reversed in this latter transfer process. U.S. Pat. No. 4,766,268 is directed to a process using at least two layers of lacquer on conventional traces to prevent solder bridging from one land to another. These latter two patents apparently contemplate the surface mounting of components, but do not address the problems raised above with respect to strengthening the bonds and delivering solder to the contact points.

It is noted that in each of the publications referenced above that the circuit traces exist only the x-y plane over the surface of the PCB. These standard PWBs or PCBs have only flat traces on the surfaces. The limitations of this technology are that they use only two dimensions (the x and y dimensions) to accommodate circuit traces and are thus space limited. Most circuits require wide traces for conducting current. Also, the fabrication process is often lengthy and expensive. The process steps can number as high as thirty-six when both through-hole and surface mount technologies are employed. Also, the solderability of traces, pads and through-holes are difficult to maintain during storage because of the very thin layer of protective solder which is applied over the copper. This is particularly true for surface mounted assembly methods.

One technique for increasing the density of traces on the PCB, that is, the number of traces in a given area, or reducing the size of the PCB is to orient the traces vertically or normal to the surface of the board, that is, in the z-direction.

In this manner, the traces may be spaced even closer together. Simply reducing both the vertical and lateral cross-section of the trace would not be advantageous since they would not be able to carry the signal current necessary to assure proper operation of the circuit. Sufficient cross-sectional area must also be provided to minimize the electrical resistance of the trace current path.

Of interest with respect to trench-type, vertical traces is U.S. Pat. No. 4,604,678 which describes a circuit board having traces extending perpendicular to the plane of the surface of the substrate. The grooves are filled by plating with an electrically conductive material. The substrate can be molded from a plateable plastic or ceramic material or the grooves can be machined by a laser beam. However, molded circuit boards with recessed, three dimensional traces are an improvement over flat traces, but the U-shaped traces act as solder thieves in assembly with components and make adequate solder joints extremely difficult if not impossible to achieve.

Although the technique of employing traces extending into the substrate surface has promised much, it remains to be successfully implemented. Such vertical or trench-like traces aggravate the problems of bonding processes, including the great plurality of steps, poor bonding strength and difficult solder delivery mentioned earlier. Additionally, while it is relatively easy to envision a circuit board with vertically-oriented traces, it is considerably less apparent how such traces are to be formed.

Another circuit board assembly that has been envisioned, but not easily produced is one where integrated circuits or "chips" are directly placed on the circuit board without the need for encasing them in a separate package, such as a plastic or ceramic. Tape automated bonding (TAB) of a small, fragile lead frame to a chip also holds great promise, but traditionally has been a difficult technology because the TAB leads are easily damaged before mounting the device on a circuit board or other substrate.

SUMMARY OF THE INVENTION

Accordingly, it is an object of the present invention to provide a circuit board with traces extending into the surface of the substrate.

It is another object of the present invention to provide at least one process for manufacturing a circuit board with generally z-direction-oriented traces.

It is yet another object of the invention to provide a structure and method for bonding electronic components to a circuit board with traces extending into the surface of the substrate by means of selective, point-of-contact delivery of a reflowable bonding material, such as solder.

In carrying out these and other objects of the invention, there is provided, in one form, a circuit board for receiving electronic components that has an insulative substrate with at least one mounting surface and a conductive material pattern positioned over the surface of the insulative substrate. The conductive material pattern is also positioned at least partially within the mounting surface. The pattern has a groove within the mounting surface, and a conductive material, such as copper, for example, at least partially filling the groove. A component lead contact region comprising a component lead receiving cavity is also present within the substrate. A second conductive material at least partially fills the cavity, where the second conductive material is in physical and electrical contact with part of the conductive material pattern, and the second conductive material, for example, solder, is more readily reflowable than the first conductive material.

BRIEF DESCRIPTION OF THE DRAWINGS

FIGS. 4-9 are a series of illustrations for one process of making the circuit boards of the present invention, wherein:

FIG. 4 is a three-quarters, sectional view of a portion of a circuit board substrate with grooves and holes therein;

FIG. 5 is the circuit board substrate of FIG. 4 after a coating of plating resist has been applied thereto;

FIG. 6 is the circuit board substrate of FIG. 5 after the grooves have been plated with an electrically conductive material;

FIG. 7 is the circuit board substrate of FIG. 6 after a solder mask is selectively placed in the grooves;

FIG. 8 is the circuit board of FIG. 7 after the grooves containing the solder mask have been filled with solder or other reflowable, conductive material;

FIG. 9 is the circuit board of FIG. 8 after removal of the solder mask to provide the solder core circuit board ready for assembly; and FIGS. 10-16 are a series of illustrations for a second process of making the circuit boards of the present invention, wherein:

FIG. 10 is a three-quarters view of a portion of a simplified circuit board substrate having a conductive material plating on opposing sides;

FIG. 11 is the circuit board substrate of FIG. 10 having a plating mask over the conductive material plating layer on opposing sides;

FIG. 12 is the circuit board substrate of FIG. 11 having a circuit pattern developed through the plating mask using photolithographic techniques;

FIG. 13 is the circuit board substrate of FIG. 12 after the areas not covered by the plating mask are plated to the desired height with a conductive material;

FIG. 14 is the circuit board under construction of FIG. 13 after the plating mask has been removed and the uniform conductive material plating layer from FIG. 10 is etched back to the substrate;

FIG. 15 is a profile view of the circuit board of FIG. 14 within an imbedding press in an open position prior to the trace imbedding step;

FIG. 16 is the circuit board of FIG. 15 with the press in closed position after the trace imbedding step; and FIGS. 17-23 are a series of illustrations for a third process of making the solder core circuit boards of the present invention, wherein:

FIG. 17 is a three-quarters view of a portion of a transfer backing plate having a thin solder coating on one side thereon and a sheet of copper solder bonded to the solder layer;

FIG. 18 is a profile view of the transfer backing plate of FIG. 17 being subjected to electrical discharge machining (EDM) to produce the circuit traces;

FIG. 19 is a three-quarters view of the transfer backing plate of FIG. 18 ready for imbedding into a thermoplastic substrate, after the conductive material layers (solder and copper) have been machined back;

FIG. 20 is a profile view of the transfer backing plate of FIG. 19 on top of a thermoplastic substrate in an open imbedding press;

FIG. 21 is a profile view of the set-up of FIG. 20 with the press closed after the imbedding of the traces in the thermoplastic substrate;

FIG. 22 is an exploded, profile view of the transfer plate being removed from the circuit board;

FIG. 23 is a three-quarters view of the finished circuit board from FIG. 22;

FIGS. 25-28 are illstrations depicting still another process of making the circuit boards of the present invention, wherein;

FIG. 25 is a three-quarters, sectional view of a portion of a circuit board with a portion of a conductive material pattern thereon;

FIG. 26 is the circuit board substrate of FIG. 25 during an imbedding process where the conductive material pattern is pressed into the substrate using an impression pattern;

FIG. 27 is an illustration of the circuit board of claim 26 after the imbedding process; and FIG. 28 is an illustration of the partial substrate of FIG. 27 where the component lead receiving cavity has been partially filled with a reflowable, conductive material, such as solder.

It will be appreciated that these illustrations are not to scale and that in some of the Figures the thicknesses and/or widths of the various features, particularly the thicknesses of the plating layers and the thicknesses and widths of the traces have been exaggerated for clarity.

DETAILED DESCRIPTION OF THE INVENTION

Figure 1:
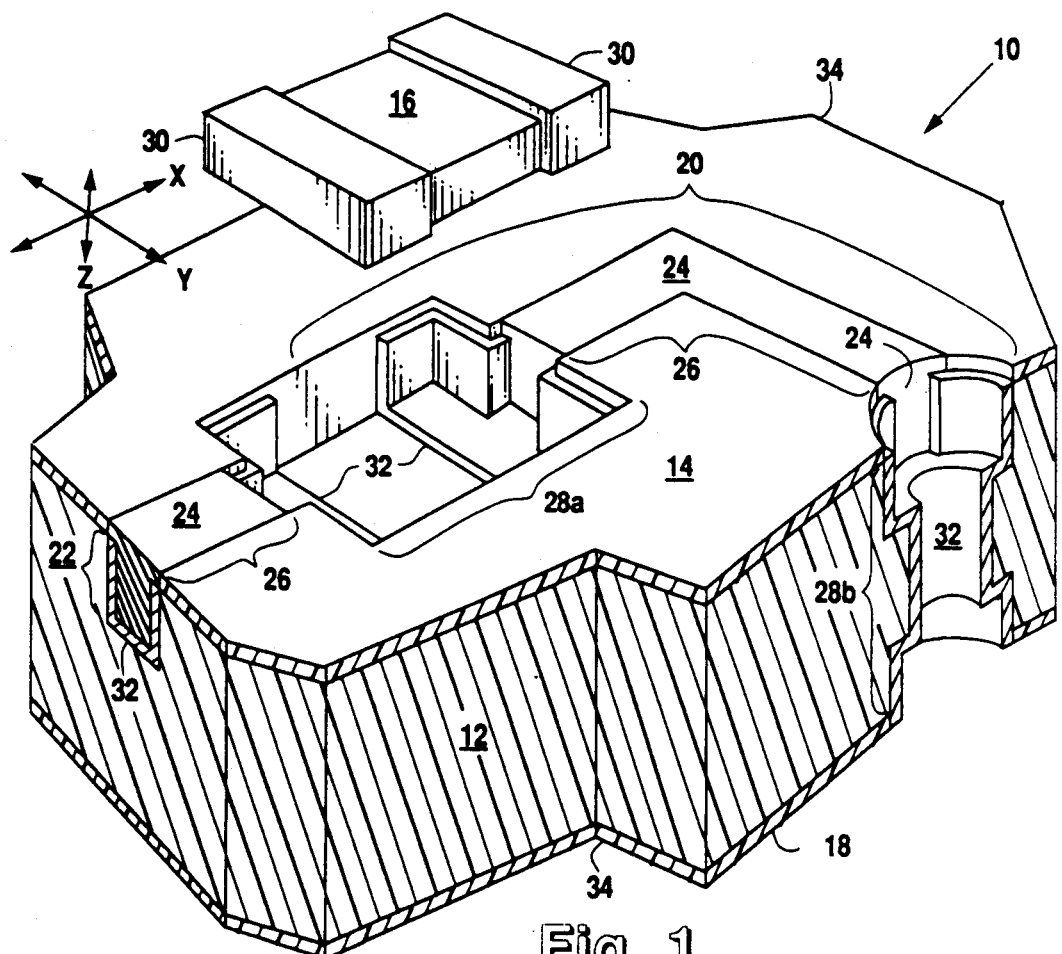
FIG. 1 is a three-quarters, partial, exploded view of a detailed portion of a circuit board of my invention illustrating how an electronic component may be mounted thereon.

The invention will now be described in more detail with reference to the various Figures. FIG. 1 presents one of the most basic versions of the present invention, seen generally as circuit board 10 which is composed of an insulating substrate 12 having at least one mounting surface 14. Of course, conventional PCBs have two opposing surfaces, and it is now common for circuit boards 10 to have electronic components 16 mounted on surface 14 as well as opposing surface 18. A conductive material pattern 20 is positioned over the mounting surface 14, and at least partially, if not completely, within the surface 14. By "within the surface" is meant that the pattern 20 exists at least to some extent below the surface 14 and within the board 10. The conductive material pattern 20 has a groove 22, also within the mounting surface 14 and may have a reflowable, conductive material 24, such as solder, at least partially filling the groove 22.

In the assembly of an electronic component 16 to board 10, groove 22 has selected regions 26 filled by the reflowable, conductive material 24, and regions 28 void of solder 24, which may be mounting regions, such as recess 28a for receiving a surface-mountable electronic component 16, or through-hole 28b for receiving the lead of a leaded component 16 (not shown). The assembly operation is straight-forward and compatible with conventional assembly techniques. The electronic components 16 are placed on the board 10 in their respective positions. In the particular form illustrated, the component 16 is placed within surface mount recess 28a. The component 16 may be held in place by a mild adhesive that is washed away in a subsequent step. Similarly, a leaded component would have one of its leads placed in through-hole 28b. Then the board 10 would be heated, as in a conventional reflow oven, and the reflowable, conductive material 24 would flow out of the grooves 22, for example by capillary action, into the areas 28 void of solder to bond with the connectors 30 on the electronic devices 16 upon cooling. The board should be designed so that at least some of the solder remains in grooves 22 to maintain the electrical integrity of the trace, or to protect the copper plating, to be described later. Conventional infrared or vapor phase heating would also produce excellent results in the reflow step.

It will be appreciated that the step of applying solder to the meeting of the device 16 leads with the conductive pattern 20 found in conventional assembly procedures is avoided in this process. Wave soldering is not required, a simple reflow heating step is all that is needed. Besides greatly simplifying bonding two kinds of components (through-hole and surface mount) to one side of the board, mounting those components to two sides of a circuit board is now made practical, even easy, since it may now be performed in one reflow step, with one kind of solder.

To assist in the reflowing of solder 24 in a controllable manner, as well as to provide traces and a pattern 20 of good integrity, the grooves 22 may be optionally selectively plated with a layer 32 of conductive material, such as copper. Note that in recess 28a, the copper layer 32 extends into the recess sufficiently to meet with and engage the connectors 30 on component 16. Thus, this portion of the copper plating 32 would help ensure that the solder 24 would reflow to and bond with connectors 30, as the solder would be inclined to preferentially wet the copper. In most cases, the material of the insulative substrate 12 should be designed to be relatively much less solder-wettable than the copper plating 32 to avoid the solder 24 reflowing entirely across recess 28a. Additionally, copper plating 32 may be optionally coated with a thin layer of solder to aid in making the solder bonds. The use of copper also aids the current carrying property of the traces since due to the "skin effect" of any conducting body, most of the current travels on the surface of the conductor.

However, regions 28 should be substantially free of solder, that is, the only solder present should be this optional coating over the copper plating 32. Significant presence of solder 24, other than accidental presence is not expected in regions 28. This concern may also be addressed by the level at which grooves 22 are filled with the reflowable, conductive material 24. It can be appreciated that grooves 22 may be only partially filled in the z-direction, or in some cases even over-filled, as long as the solder 24 may be properly channeled upon the reflowing assembly step. In one aspect the bottom of grooves 22 are about 0.020 in. below the mounting surface 18 and grooves 22 may be from about 0.004 to 0.008 in. wide, although it will be understood that other dimensions may be employed within the scope of the invention.

Mounting surfaces 14 and 18 may be coated with a permanent or temporary plating resist layer 34 to assist in the plating and filling of grooves 12. Through-hole 28b may also be employed as a mechanism for electrically connecting the conductive material pattern 20 of one surface 14 with pattern 20 of its opposing surface 18.

Figure 2:
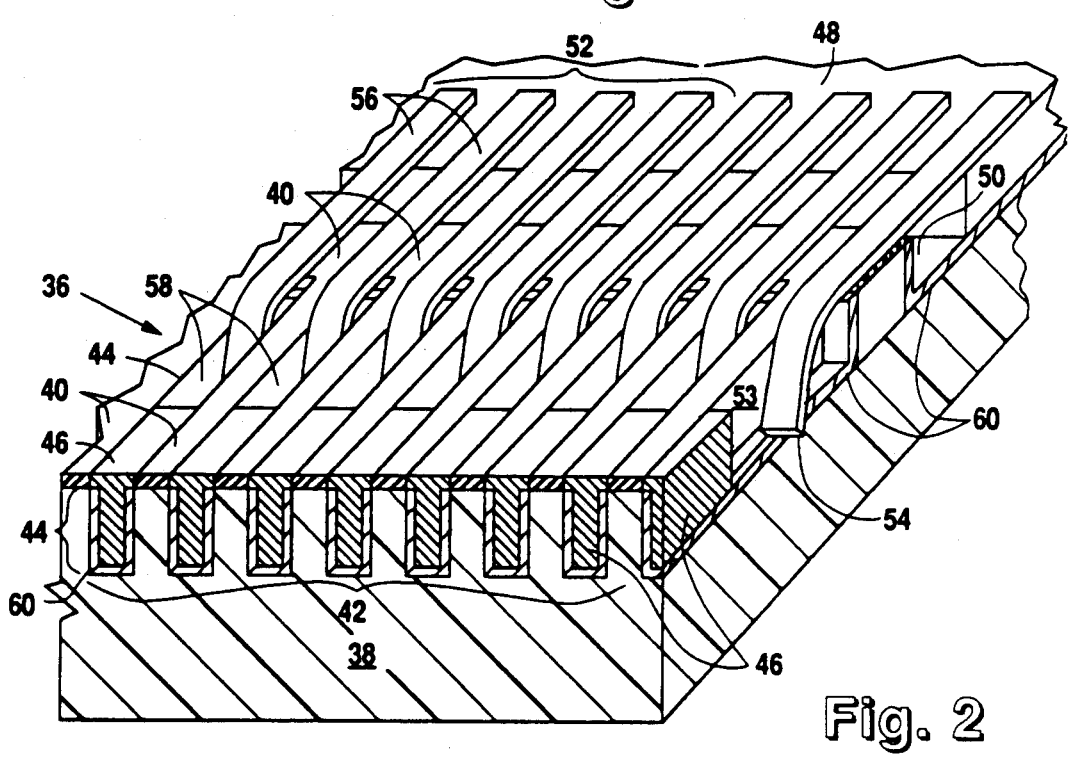
FIG. 2 is a three-quarters, partial view of a detailed portion of another circuit board of my invention showing how an integrated circuit chip with a TAB frame thereon may be bonded to the circuit board.

FIG. 2 illustrates another assembly structure and technique of the invention. Here, circuit board 36 has an insulative substrate 38 with a mounting surface 40 having a conductive material pattern 42 therein which is composed of a plurality of grooves 44 partially filled in the x-y directions by a reflowable, electrically conductive material 46. An integrated circuit (IC) chip 48 is present in recess 50 of the pattern 42. The chip 48 has a tape-automated bonded (TAB) frame 52 directly bonded thereto. The distal ends 54 of the leads 56 of the TAB frame 52 overlap the surface 40 of the board 36 and are bent downward into regions 58 of grooves 44 not filled with solder 46. Optional electrically conductive plating 60 (e.g., copper) may be provided in the grooves 44 and recesses 50 of conductive material pattern 42 to improve the electrical connections of the traces (filled grooves) and also to provide a backside connection to the IC chip 48 which is often required.

The insertion of an IC chip 48 bearing TAB frame 52 leads 56 into a circuit board 36 of this invention is treated with more detail later with respect to the discussion of FIG. 3. However, the electrical and physical bonding of the chip 48 into board 36 may be accomplished similarly to the operation discussed with respect to FIG. 1; namely, the board 36 with chip 48 in place is heated to a temperature sufficient to reflow solder 46 along grooves 44 to regions 58 not containing solder, but rather distal ends 54 of TAB leads 56. Upon cooling, solder 46 forms an electrical and physical connection of the TAB frame 52 of chip 48 to the conductive material pattern 42. Note that only one alignment is required, and that is simply the placement of IC 48 on board 36. The bonding of the fragile TAB lead ends 54 is done simultaneously, with no alignment concern, and in a manner that permits the lead ends 54 to be protected within groove 44 portions 58 without solder 46 during the bonding process.

Figure 3:
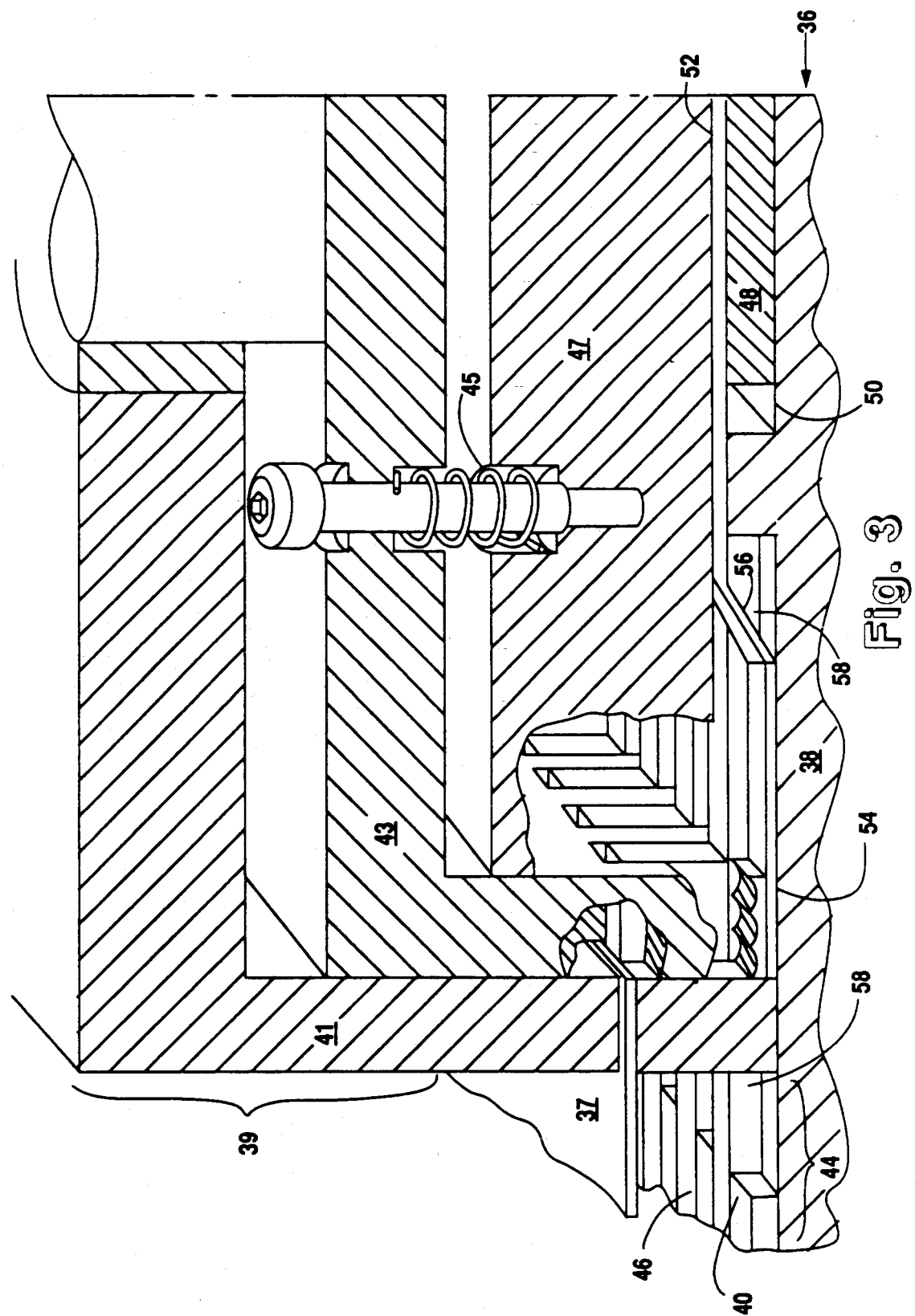
FIG. 3 is a three-quarters, cut-away view of an excising tool in the process of simultaneously excising a TAB-frame mounted integrated circuit away from its support frame and placing it within a circuit board of the present invention.

Shown in FIG. 3 is one form of a process that may be used to simultaneously excise a TAB-mounted IC 48 from the surrounding TAB lead frame, typically in the form of a square or rectangle surrounding the IC 48, as well as to place the TAB-mounted IC 48 into the circuit board 38. The same reference numerals used in FIG. 2 will be used in the discussion of FIG. 3 for like elements. Excising and placement tool 39 has a die assembly 41 carrying a punch assembly 43 in turn having resiliently mounted thereon by way of springs 45 or other mechanism a pressure pad 47. In operation, the die assembly 41 together with punch assembly 43 and TAB-mounted IC 48 within and attached to frame 37 are registered with each other and solder core circuit board 36. This is the only registration step required in the assembly procedure. Punch assembly 43 comes down and excises the distal ends 54 of the leads 56 from TAB frame 37 and pushes the distal ends 54 into regions 58 of groove 44 not filled with solder 46, while pressure pad 47 simultaneously places IC chip 48 into recess 50. While other techniques and mechanisms may be used to place ICs 48 and electronic components 16 (FIG. 1) into solder core circuit boards, one important advantage to the method illustrated in FIG. 3 is that the excising and placement steps occur together so that the fragile distal lead ends 54, which are essentially a thin foil, are protected within region 58 as soon as they are excised and are not otherwise exposed to the possibility of damage prior to the bonding step described with respect to FIG. 2. The promise of TAB and its attendant advantages has never been realized because of the difficulties of handling the component once the TAB leads are excised and free to be damaged. It is apparent that solder core circuit boards bearing ICs that are not in conventional plastic or ceramic packages should be protected after assembly is complete by coating or casting the circuit board with a plastic or perhaps even a ceramic by known techniques.

While it has often been conceived that circuit traces in a PCB may be oriented in the z-direction (see FIG. 1 for orientation of z-axis) for many reasons, such as to save space, as discussed previously, there has yet to be proposed workable methods for producing circuit boards, "printed" or otherwise, using available technology. It is believed that a number of techniques for making the circuit boards of the present invention may be employed, and a few shall be described herein. It will be appreciated that the scope of the invention is not restricted to a particular method of manufacture, unless so limited by the claims appended hereto.

Figure 4:
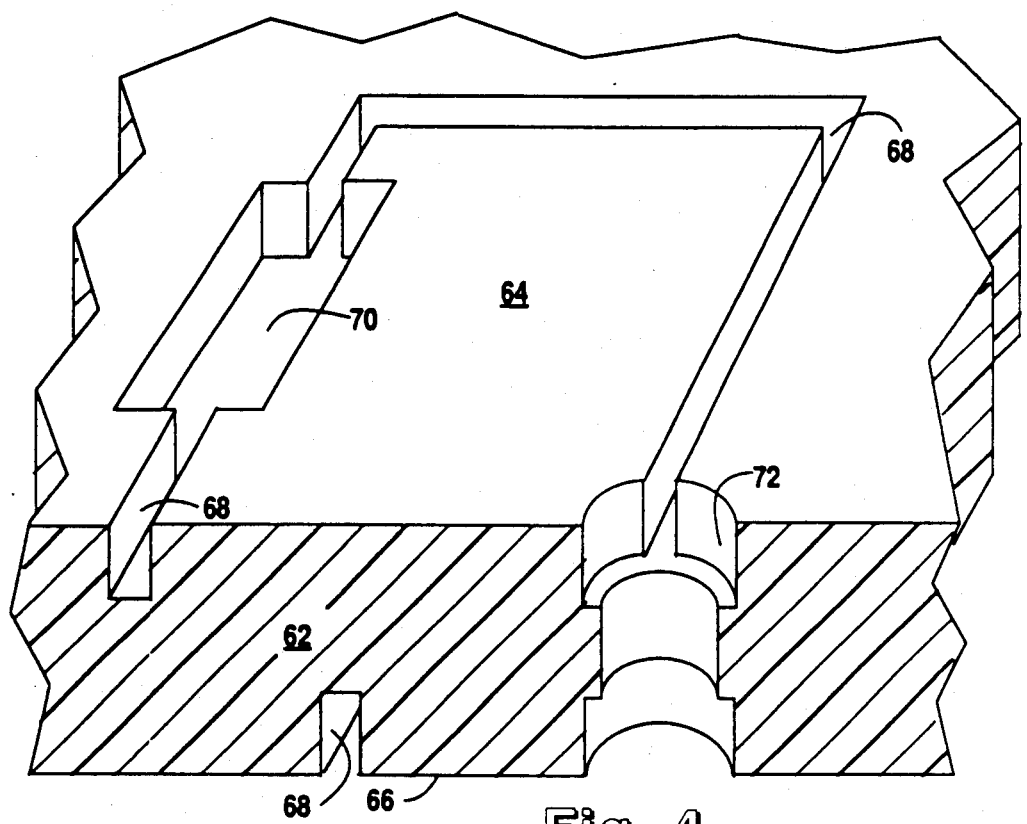

Shown over FIGS. 4–9 is one possible method of forming the solder core circuit boards of the present invention. Similar reference numbers for the various elements will be used through this series of Figures. As seen in FIG. 4, an insulative thermoplastic substrate 62 is provided; the substrate 62 is preferably a high temperature thermoplastic such as, but not limited to, polyethersulfone, polyetherimide, etc. Substrate 62 has a first mounting surface 64 and a second mounting surface 66 and circuit trace grooves 68, recesses 70 to receive electronic components and holes 72 to receive components or communicate between surfaces 64 and 66, molded therein by conventional molding means, such as reaction injection molding. Grooves 68, recesses 70 and holes 72 may be made by any suitable procedure besides molding, such as by laser or other technique.

Figure 5:
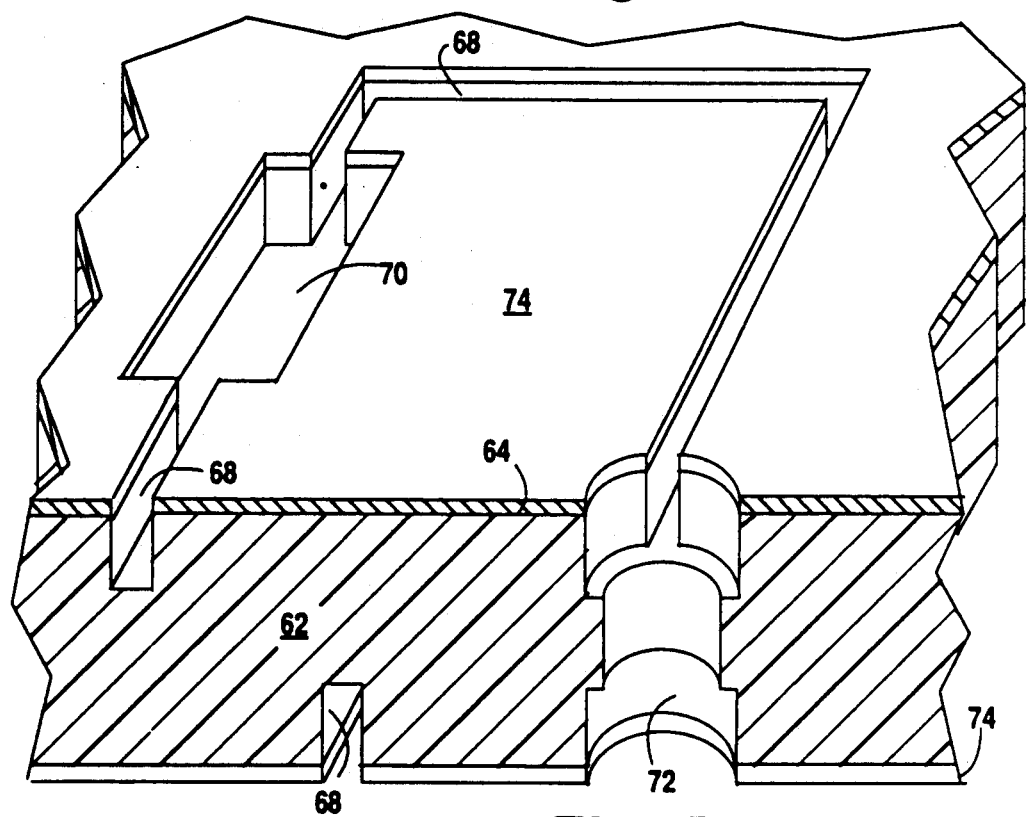

Next, surfaces 64 and 66 and grooves 68, recesses 70 and holes 72 may be subjected to an adhesion promotion step to facilitate the plating of an electrically conductive material thereto. Typically, this may be by a "swell and etch" process whereby the surfaces are chemically treated with a mild acid or other chemical to swell the surface which is then etched back with another chemical to roughen the surfaces to be plated. This adhesion promotion step provides locking sites for the electroless plating layer to adhere to, and the treatment is usually limited in depth, to about 2-5 microns ($\mu$m). Such adhesion promotion steps are well-known in the art. Next, as shown in FIG. 5, surfaces 64 and 66 are provided with a plating resist layer 74 to cover those areas which are not to be plated. Plating resist layer 74 may be provided by screening or other known technique.

Figure 6:
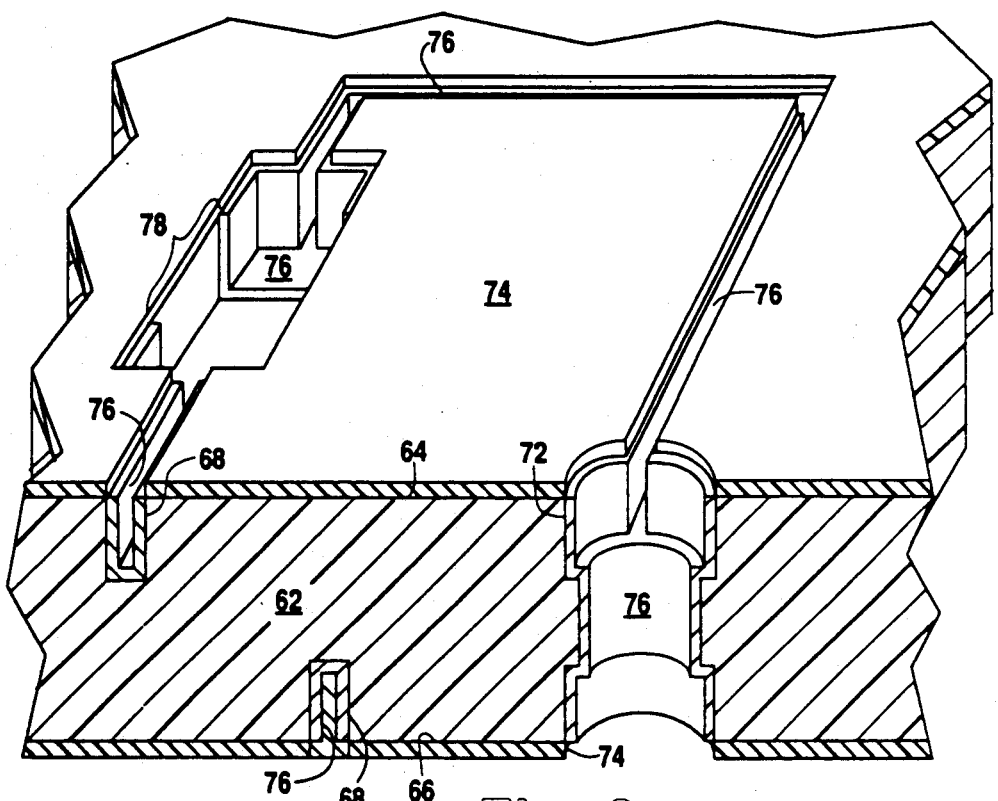

The structure of FIG. 5 is subsequently plated with a thin layer 76 of an electrically conductive material such as a metal, for example copper. Note that layer 76 fills grooves 68, recess 70, and hole 72. A gap 78 is shown between the two ends of recess 70 where no copper layer 76 is present. This gap 78 may be provided by selectively etching a portion of layer 76 using conventional photolithographic techniques, or may be masked from plating by an appropriately placed portion of plating resist layer 74 to give the circuit board under construction as seen in FIG. 6. The copper layer 76 may be provided by additive or semi-additive plating techniques and should be of a minimum thickness of 0.0007 in. Optionally, layer 76 may be itself plated with a thick solderable material, such as tin or solder or other material (not shown). This solderable layer preferably has a minimum thickness of 0.001 in., by way of example only. These layers are not deposited where resist layer 74 is present. Next, areas of the grooves 68, recesses 70 and holes 72 that are not to be filled with the reflowable conductive material are filled with a solder mask 80 to give the structure shown in FIG. 7. It will be appreciated that solder mask 80 should be present in all of the areas where solder should not be present such as the bonding areas of recesses 70 or holes 72, or other regions where contact with an electronic component and subsequent reflow bonding is to take place. The solder mask 80 may be screened or stenciled on or otherwise applied by known techniques, including, but not limited to plating, depositing, coating, sputtering, or combinations of these techniques. In one aspect, solder mask 80 is preferred to be a conventional, curable photoresist. It is preferred that the mask 80 be cured to harden it so that it may be durable enough to withstand the solder application in the next step.

Figure 7:
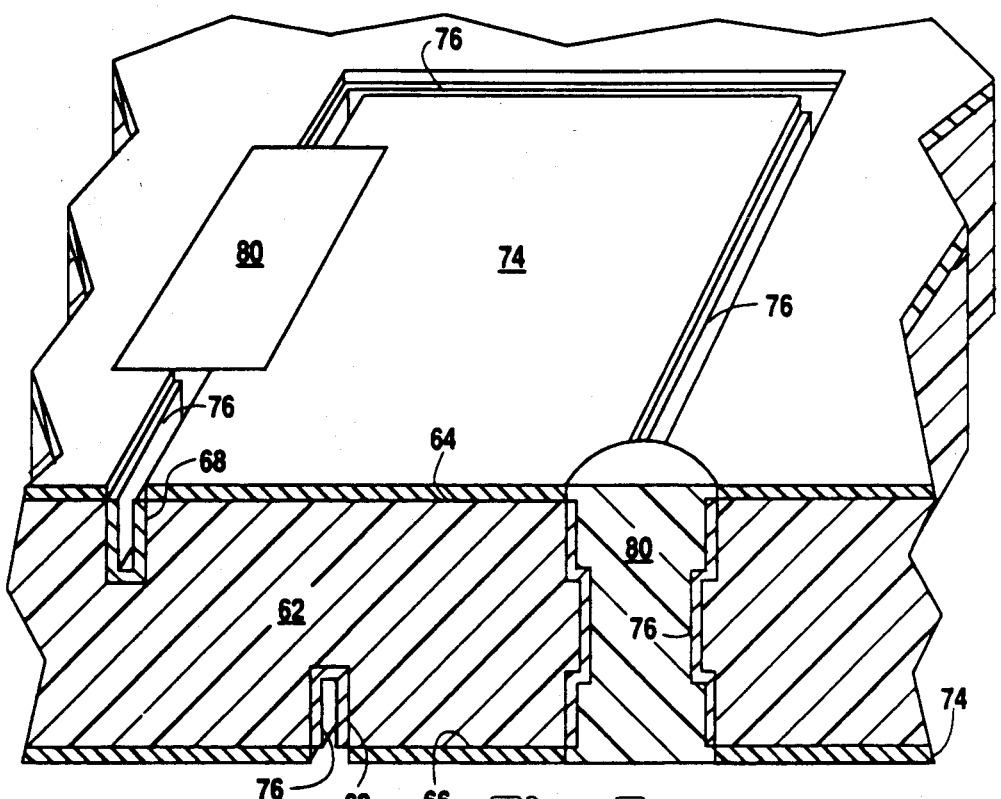
Figure 8:
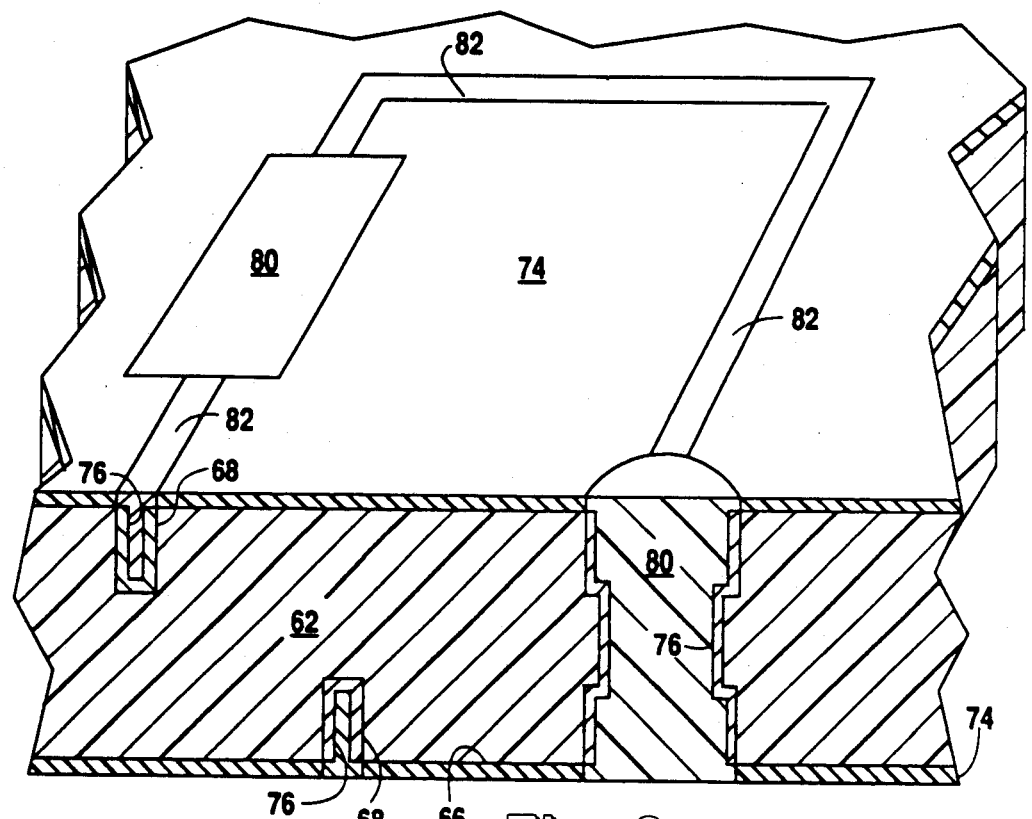

Shown in FIG. 8 is the structure of FIG. 7 after the grooves 68 have been bonded and filled with a reflowable, electrically conductive material 82, such as solder, to form traces. This solder filling step may be accomplished by any technique such as plating, coating and washing back, etc. Note that the solder 82 has filled all places where solder mask 80 is not present. It is anticipated that solder 82 will primarily be present in the grooves 68, although embodiments of the invention may be envisioned where a recess 70 or a hole 72 may be partially or completely filled with solder 82 as well. Further, it should be appreciated that although FIG. 8 shows that groove 68 is completely filled with solder so as to be flush with the mounting surface 64, or plating resist 74 in this case, the invention may also be practiced by only partially filling groove 68 or even overfilling groove 68. An obvious concern with overfilling the groove is that shorts may occur between grooves, which is to be avoided.

Figure 9:
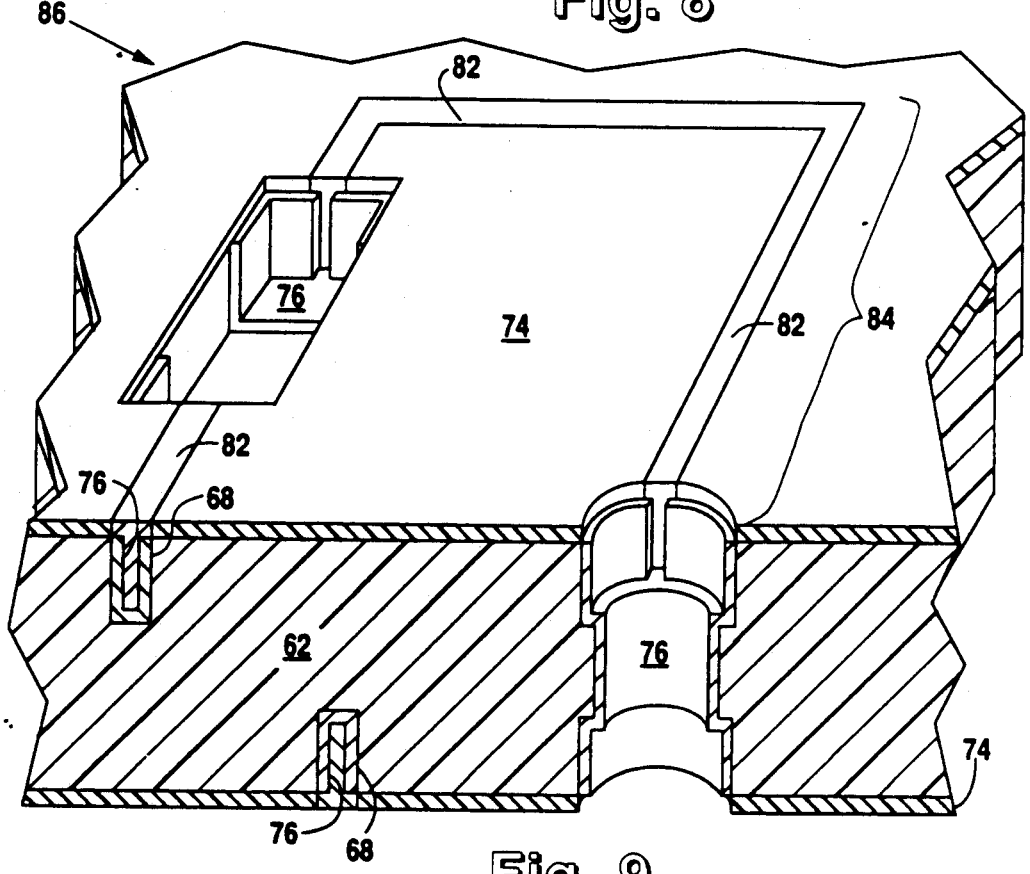

Finally, the solder mask 80 may be removed to give the finished solder core circuit board 86 of FIG. 9. A conductive material pattern 84 is formed by the grooves 68, recesses 70, holes 72 and the reflowable conductive material 82 that partially or completely fills some of these structures, and which may be selectively placed, in some aspects of the invention. Plating resist 74 may be optionally removed, depending upon its durability, specifically whether it may withstand the subsequent assembly procedures. The circuit board 86 may now be used in an assembly procedure as described previously in connection with FIG. 1.

FIGS. 10–16 illustrate another embodiment of the circuit boards having imbedded traces of the present invention and a method for making them. This second alternative is attractive because it overcomes some disadvantages of the process described above with respect to FIGS. 4–9. The first process requires an insulative substrate which can be plated. The plating procedure requires very good and consistent adhesion. As noted, an adhesion promotion step is recommended. Typically, adhesion promotion procedures require expensive capital equipment and/or highly active chemicals which are usually hazardous to workers. Further, there are very few thermoplastics which can meet the thermal, electrical and mechanical requirements for quality circuit boards and also have acceptable plating adhesion. Another limiting parameter is the plating processes available. These problems are aggravated for larger circuit boards.

Figure 10:
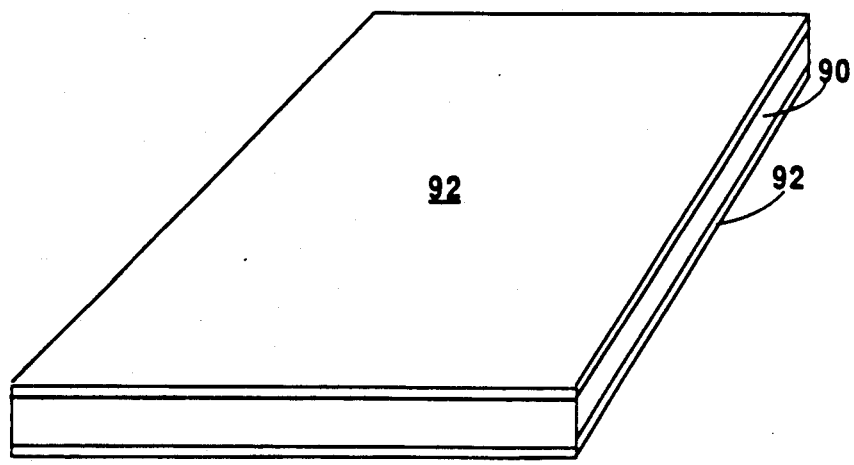
Figure 11:
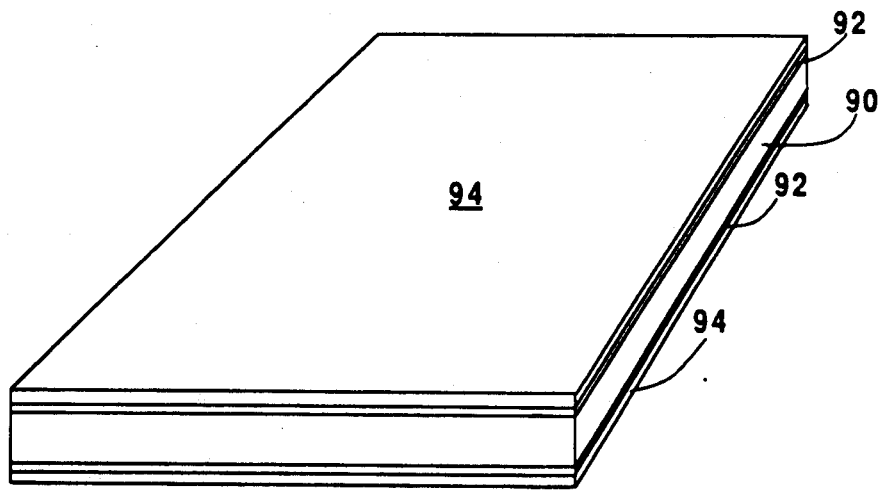

Shown in FIG. 10 is an extruded sheet of thermoplastic 90 plated on both sides with a thin layer 92 of an electrically conductive material such as copper. The size and thickness of both structures may be chosen by the engineer for a particular application. In one aspect the nominal plating thickness is 10–12 $\mu$m. A plating mask 94 is applied to a desired depth to give the structure shown in FIG. 11. A suggested depth is 0.040 in. maximum. Any suitable photocurable mask may be used, for example, Chemline "Fanton" which is commercially available, although others may be used, of course.

Figure 12:
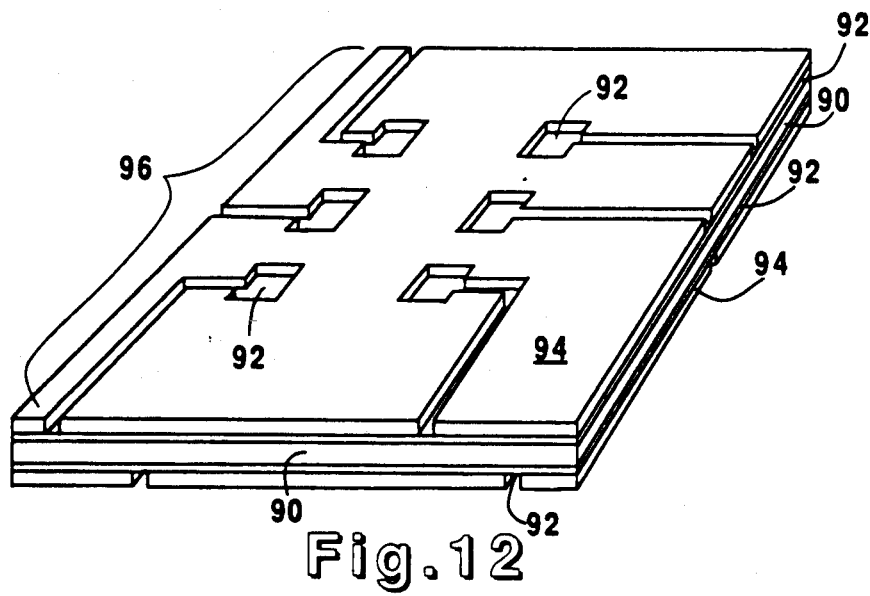

Next, the circuit pattern 96 is developed through the plating mask 94 using conventional photolithographic techniques, which are well known in the circuit board and integrated circuit industry. It will be appreciated that the circuit pattern 96 is extremely simple for clarity of illustration, designed for a dual-in-line package with two rows of three leads each, and that actual circuit patterns would be very complex. Mask 94 would remain largely in place while the flash or copper plating 92 would be exposed in the places where mask 94 had been washed away, as illustrated in FIG. 12.

Figure 13:
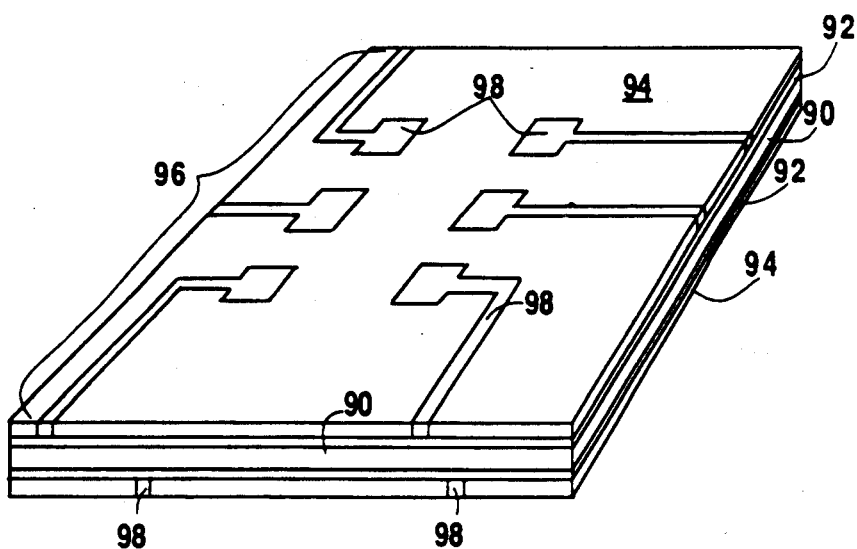
Figure 14:
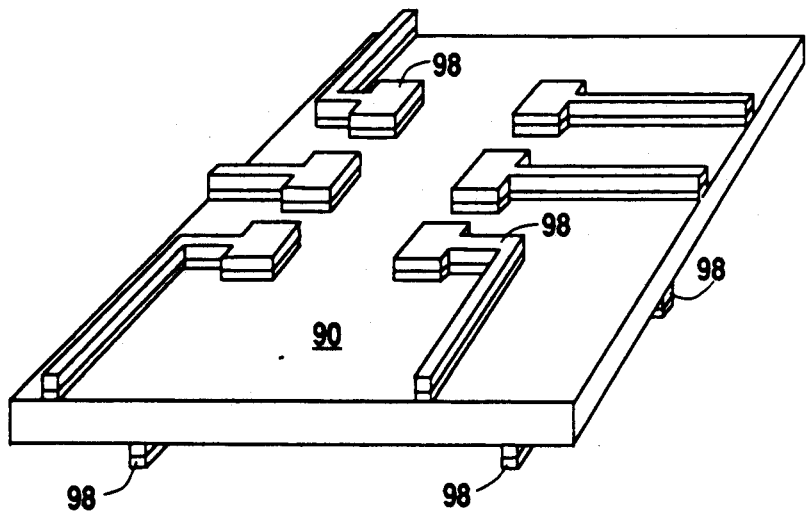

The copper cladding 92 on the thermoplastic substrate 90 serves as a cathode for electroplating. All apertures in the mask 94 are now plated with copper or another electrically conductive material to a desired height to give positive circuit pattern 98, as seen in FIG. 13. Optionally, a protective coating, such as solder (not shown), may be given to the last-formed portions of positive pattern 98. Next, plating mask 94 is stripped off, and conductive material plate 92 is etched back in an acid bath by conventional means to provide the positive circuit pattern 98 as seen in FIG. 14 ready for imbedding.

Figure 15:
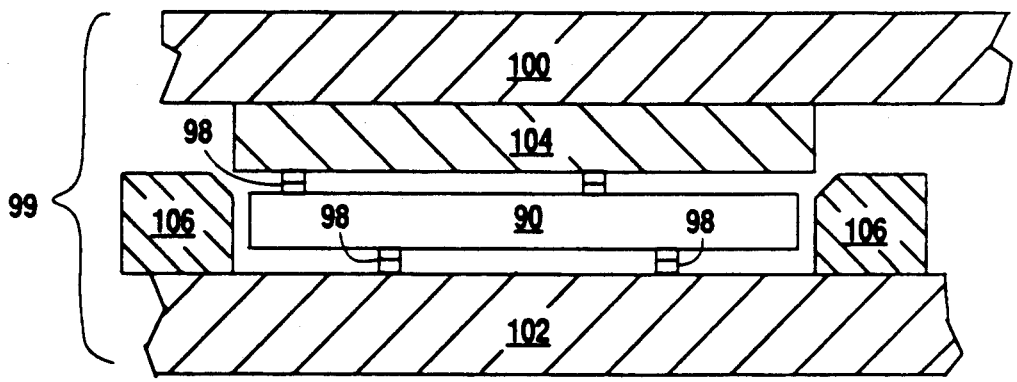
Figure 16:
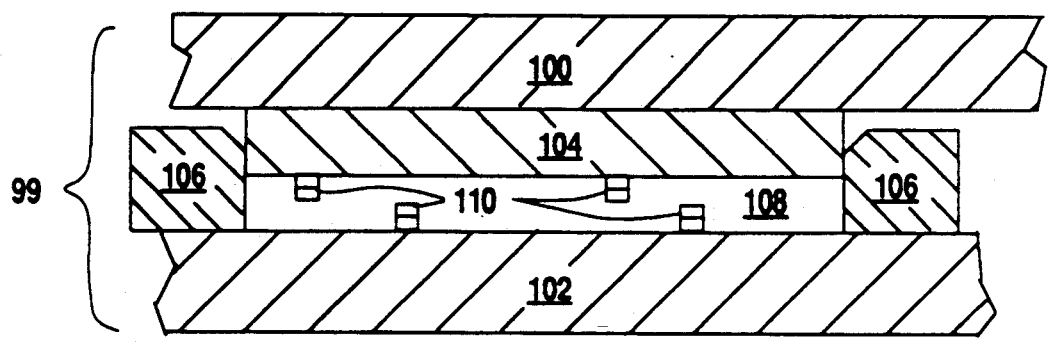

FIGS. 15 and 16 are simple schematic illustrations of the imbedding procedure, with FIG. 15 showing an open imbedding press 99 with the thermoplastic substrate sheet 90 bearing the positive circuit pattern 98 thereon between an upper platen 100 and a lower platen 102. A riser 104 is present between the upper circuit pattern 98 and the upper platen 100 to insure a smooth imbedding force. The imbedding process involves heating the substrate 90 to its softening point, a temperature which will vary with each plastic type. The press 99 is then closed to press and imbed the positive circuit pattern 98 into the substrate 90. The lateral expansion of the substrate 90 is limited by plastic flow retainer 106, as shown in FIG. 16. Thus, a circuit board 108 with an imbedded copper trace 110 may be provided. Board 108 thus permits extremely dense circuit traces without loss of conductor cross sectional area. In one aspect, the traces may vary from 0.002 in. wide and 0.020 in. deep (i.e., in the z-direction) to as much as 1.0 in. wide and 0.2 in. deep in some applications. The spacing between traces in not limiting and will be determined by electrical considerations coupled with materials performance. If certain of the traces need to be of larger cross section, such as for a high power application, such traces can be easily provided on the same board bearing smaller cross sections using this method.

The advantages of imbedded trace circuit boards and the method for making them illustrated in FIGS. 10-16 include elimination of adhesion problems that arise with different plastics; all thermoplastics are now useful with this technology. Also, highly active, hazardous chemicals used for adhesion promotion are not required. Very large area circuit boards may also be easily fabricated with this relatively simple procedure. Additionally, the trace circuitry is encapsulated or imbedded and thus protected from damage during handling and assembly.

Finally, the copper trace 110 may be etched back and selectively filled with solder using the conventional photolithographic techniques described with respect to FIGS. 4-9 to give a solder core circuit board such as those seen in FIGS. 1 and 9.

Shown in FIGS. 17-23 is a third technique for making the solder core circuit boards of the invention which is similar to the procedure of FIGS. 10-16 in that it imbeds a copper trace pattern into a substrate, but differs from that method in that a reusable transfer plate is used and the circuit pattern is reversed or inverted during the process.

In the current art of making PCBs, an insulative substrate is laminated with copper film of appropriate thickness on one or both sides thereof. The copper laminate is then processed through a series of photo screen mask and etching steps to result in an arrangement of interconnect traces as required to complete an electronic circuit. One of the inherent limitations of this process is that etching occurs in all exposed copper at equal rates. The pattern mask which protects the top surface from etching cannot protect the sides of the etching channel as the acid etchant removes unwanted copper. This lateral component of the etching process results in what is commonly called a "kerf". The resulting kerf is a limiting factor for circuit trace geometry in the width vs. thickness aspect ratio, previously discussed with respect to high density circuit boards. Also affected is the spacing between traces.

In this aspect of the invention, the unwanted copper of the laminate is removed by electrical discharge machining (EDM) which results in straight side traces without limiting the trace thickness. The procedure allows more favorable cross sections for current carrying capability and finer trace spacing. The procedure also improves the cost of fabrication as there will be no recurring costs of imaging and masking. The procedure would also be applicable to both laminated plastics, such as FR-4 and molded circuit boards, discussed previously. As will be illustrated in the following discussion, another application is to create high aspect ratio circuit traces on thermoplastic or thermoset substrates by imbedding them using heat and/or pressure.

Figure 17:
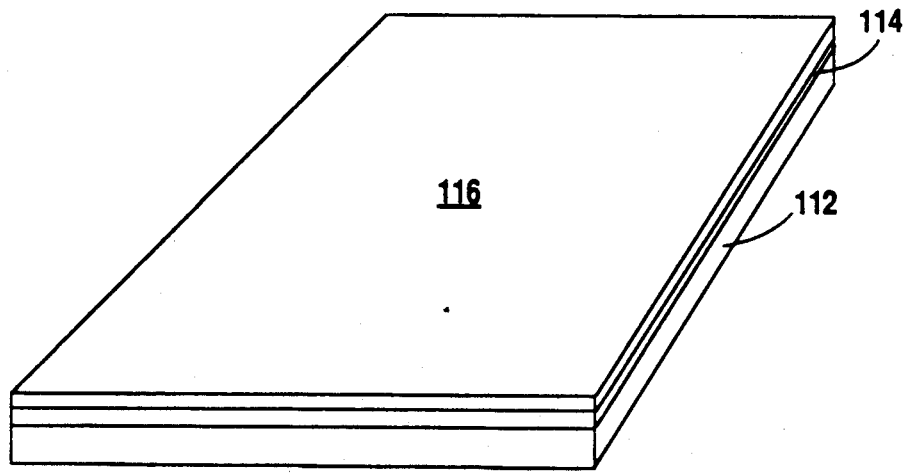

FIG. 17 shows the transfer plate 112, which must be rigid enough to hold its form with no bow or warp during normal processing and handling, which is particularly important if it is to be reused. Transfer plate 112 must be of sufficient size to contain the desired circuitry and must be flat and parallel within the finished board specifications. Plate 112 must be plateable by copper and/or solder, or whatever materials may be employed, and should be both a good electrical and a good thermal conductor. The transfer plate 112 should be coated or plated on one side with a solder layer 114, which has a suggested minimum thickness of 0.0002 in. A sheet of copper 116 should be solder bonded flat to the solder face 114 of the transfer plate 112 to give the structure seen in FIG. 17. The copper sheet 116 should be of a thickness to suit the designer's need.

Figure 18:
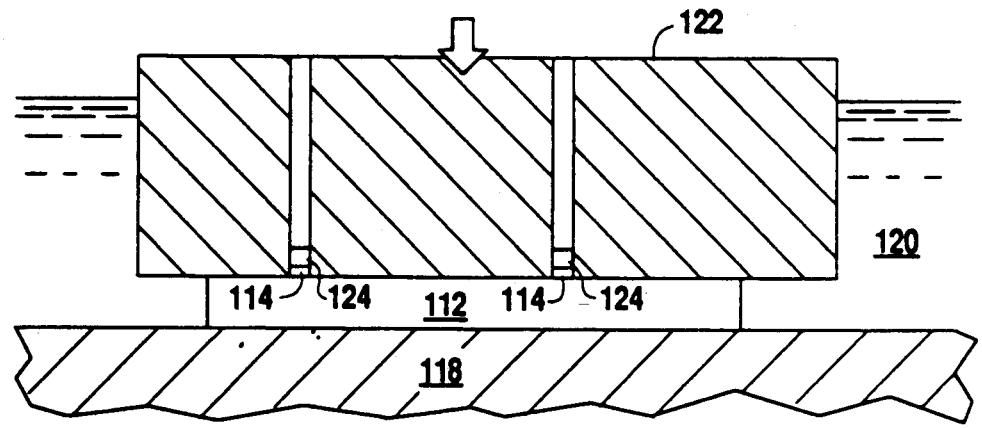
Figure 19:
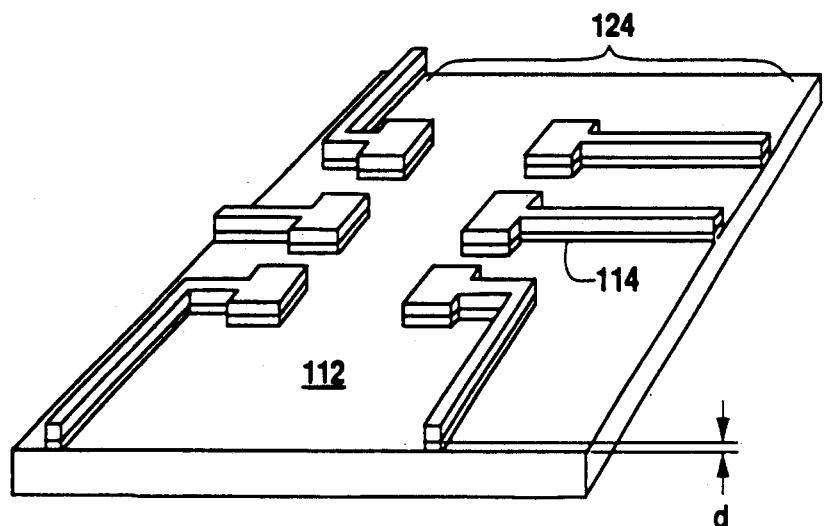

As shown in FIG. 18, the transfer plate 112 is next subjected to a die sink procedure using an electrical discharge machining (EDM) process. In this procedure, the transfer plate 112 is placed on a work table 118 submerged in an insulative (dielectric) fluid 120. A master pattern 122 is used as an electrode and must be electrically conductive. As the master pattern 122 descends in the direction shown, small intense sparks are generated wherever the gap between the pattern 122 and the surface of the copper sheet 116 is reduced. Erosion occurs on the pattern 122 and the sheet 116, but at negative polarity, the master pattern 122 erodes only one fourth to one tenth as rapidly as the copper sheet 116 at positive polarity. The copper sheet 116 should be designed or treated so that distortion due to heat treatment is eliminated. The dielectric fluid 120 must circulate at all times to remove the minute particles which are formed between pattern 112 and sheet 116. It is apparent that the process should be stopped before transfer plate 112 is etched so that transfer plate 112 may be reused. The EDM process is a single pass operation, with the electrode master pattern 122 made by wire EDM or a phototool plate up through a thick film mask. EDM die sinking is a well-known art, and produces the machined circuit transfer plate 112 shown in FIG. 19 bearing circuit traces 124. Dimension d is optional; its function is to imbed the circuit traces 124 below the substrate surface, rather than flush with the surface.

Figure 20:
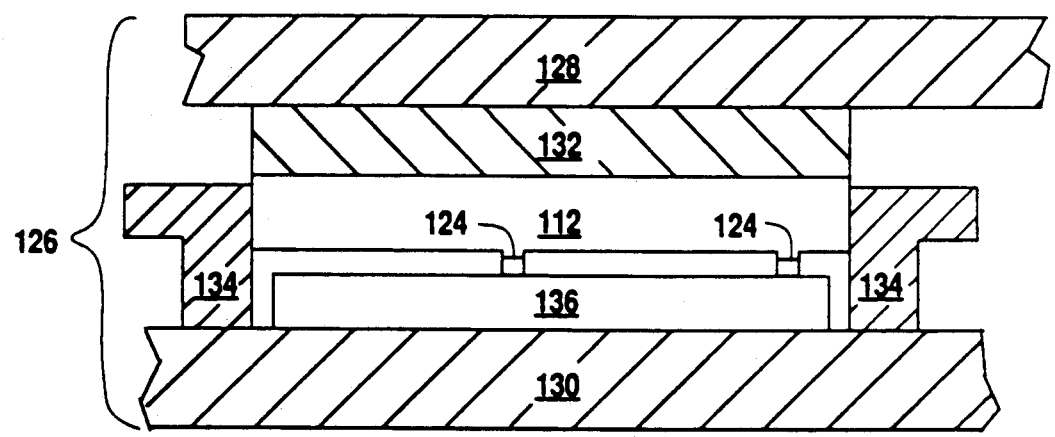
Figure 21:
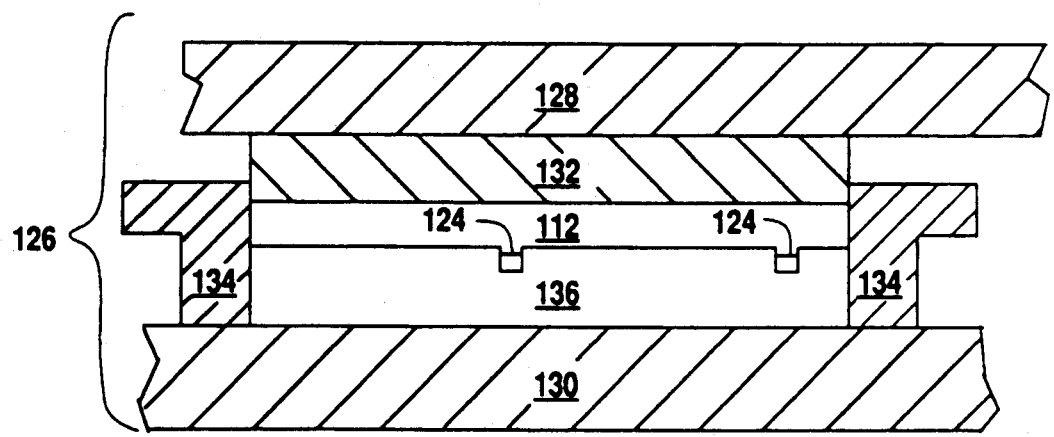

FIG. 20 next illustrates the transfer plate 112 in an open hydraulic imbedding press 126 having an upper platen 128, lower platen 130, riser 132 and plastic flow containing ring 134, similar to the apparatus of FIG. 15. In this case, circuit transfer plate 112 bearing the circuit traces 124 is inverted onto a thermo-plastic, extruded flat substrate 136. The imbedding procedure is similar to that described earlier: the thermoplastic substrate 136 is heated to or above its softening point, upper platen 128 presses riser 132 to force circuit transfer plate 112 to imbed the circuit traces 124 into substrate 136. Flow retaining ring 134 allows lateral expansion of substrate 136, but only so much as to account for volume displacement from the imbedding of circuit traces 124, as seen in FIG. 21. Again, the thermoplastic of substrate 136 should be chosen with appropriate softening temperature (not so high as to damage traces 124), and viscosity and flow characteristics for this operation (to fill the space within a relatively quick time, e.g.), which selection is commonplace in the art.

In another version of the invention, the substrate 136 may be a thermoset plastic or other substance that may be molded once, and the imbedding process may be an insert molding procedure whereby the transfer plate 112 is one surface of the mold into which a thermoset plastic or other material is injected. Processing for either of these methods would then continue with the transfer plate 112 separation.

Figure 22:
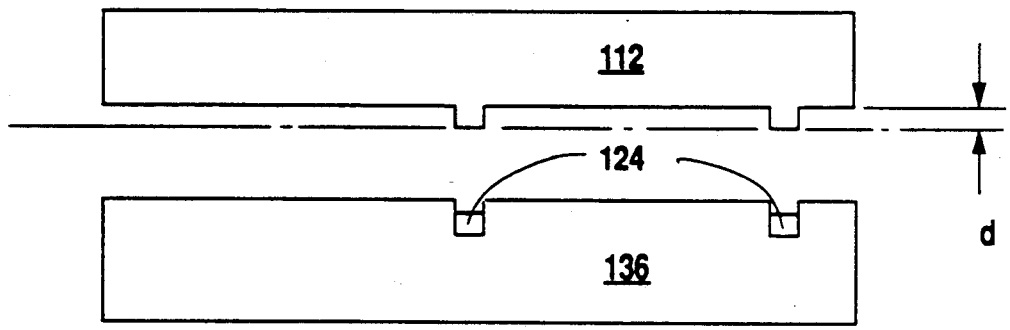
Figure 23:
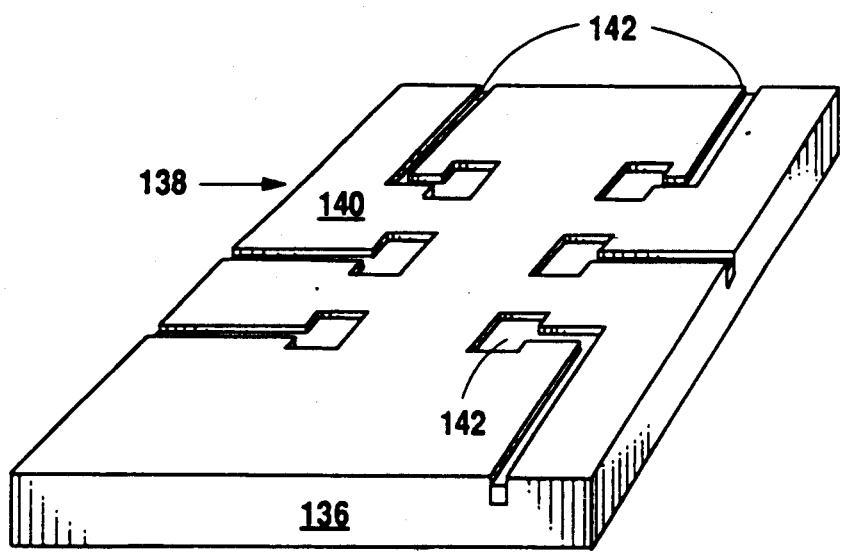

Next, the transfer plate 112 should be heated to the melting point of the solder layer 114, which may be around 437° F., e.g., depending on the exact composition of the solder, to release it and separate it from the circuit traces 124, leaving traces 124 imbedded in substrate 136 as shown in FIG. 22. In the particular embodiment shown in FIG. 22, an offset dimension d is provided, which may be made up of solder or the transfer backing plate material, or other material, to imbed the circuit traces a selected distance into the substrate 136. Thus, a circuit board 138 is provided as shown in FIG. 23 having a mounting surface 140 containing a pattern of grooves 142 having a conductive material, such as copper, therein. Such a board has many of the advantages of the circuit boards with imbedded traces previously discussed. For example, if certain of the traces need to be of larger cross section, such as for a high power application, such traces can be easily provided on the same board bearing smaller cross sections using this method.

The advantages of imbedded trace circuit boards and this transfer method for making them illustrated in FIGS. 17–23 also include elimination of adhesion problems that arise with different plastics; all thermoplastics and even thermosets are useful with this technology. Also, the highly active, hazardous chemicals used for adhesion promotion may be avoided. Large area circuit boards may also be easily fabricated with this relatively simple procedure, and the trace circuitry is imbedded and thus protected from damage during handling and assembly.

Grooves 142 may be completely, partially or selectively filled with a reflowable conductive material such as solder, described previously, to produce the solder core circuit boards of the present invention. If no offset d is present, the circuit traces 124 may need to be etched back to accommodate the volume of the solder. It should be noted that the pattern of grooves 142 on board 138 in FIG. 23 is the reverse of the pattern seen on the transfer plate 112 of FIG. 19. In one aspect, circuit traces 124 are from about 0.007–0.008 in. wide and have their bottom surfaces (bottom of the groove formed during imbedding) 0.020 in. below surface 140, with the top of copper trace 124 about 0.010 in. below surface 140. However, it should be noted that these dimensions are merely given as illustrative and are not intended to limit the invention.

Shown in FIGS. 24 through 29 is another version of the invention where the reflowable conductive material is physically located only at the points where electrical contact is to be made in the reflow bonding step. Also shown is a method for making such a structure.

Figure 24:
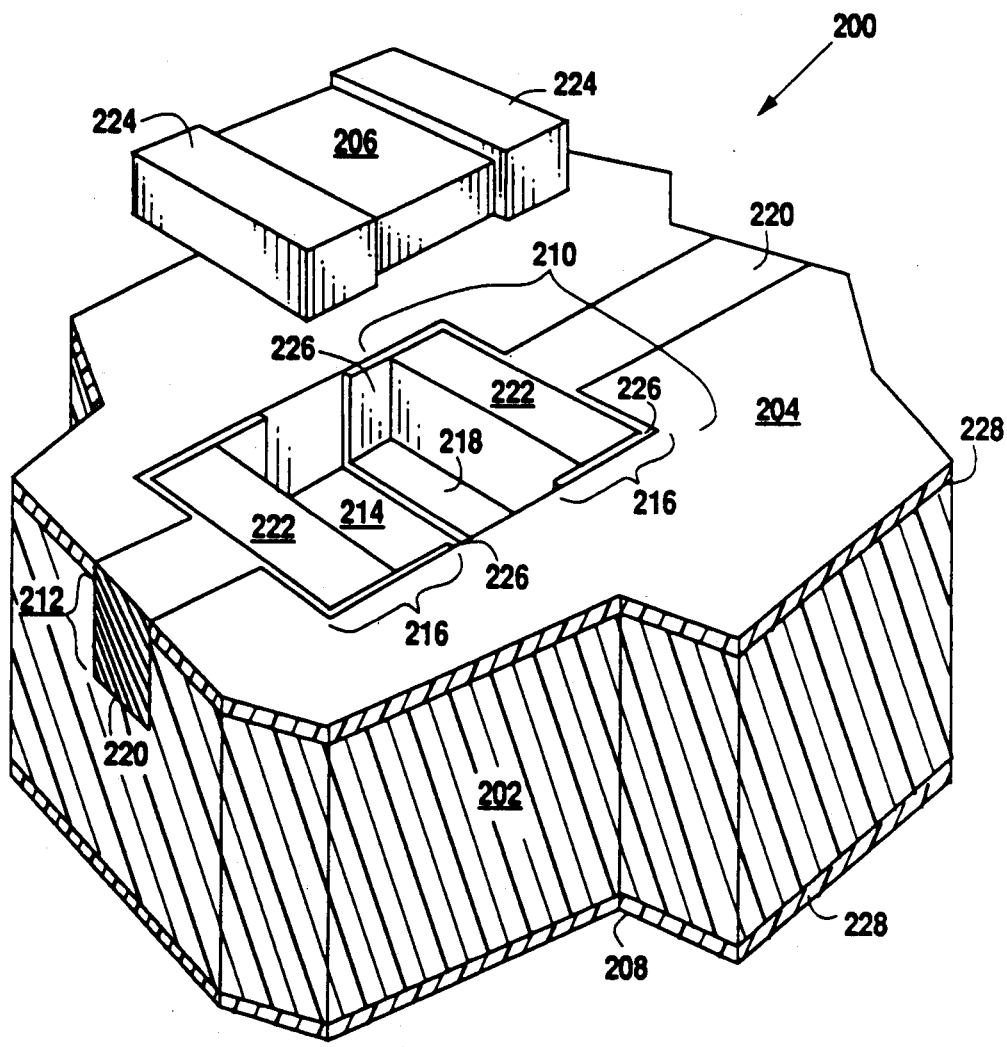
FIG. 24 is a three-quarters, partial, exploded view of a detailed portion of an alternate embodiment of the circuit board of my invention illustrating how an electronic component may be mounted thereon.

FIG. 24 illustrates the over-all circuit board 200 having an insulating substrate 202, and a mounting surface 204 on at least one side thereof to receive and have mounted thereon a plurality of electronic components 206, one of which is shown. An opposing mounting surface 208 may also be present on the reverse side and it will be understood that components 206 may be mounted thereon as well in a manner that will be described below. A conductive material pattern 210 is present on mounting surface 204, and pattern 210 comprises a plurality of grooves 212 and recesses 214. The recesses 214 may have one or more component lead contact regions 216 as a part thereof, which contact regions 216 may have a component lead receiving cavity 218. The component lead contact regions 216 and lead receiving cavities 218 are on the substrate surface 204, which herein includes positions not only on top of the flat face of the surface 204, but also beneath or within the face.

Unlike versions previously described, in this embodiment of the invention, groove 212 is at least partially filled with a first conductive material 220 that is relatively less reflowable, such as copper, and only component lead receiving cavity 218 is at least partially filled with a second conductive material 222 that is relatively more reflowable upon the application of heat, such as solder or the like, as seen in FIG. 24. The exact physical arrangement of solder 222 in cavity 218 is immaterial as long as upon reflow the material 222 can reflow and bond a connector 224 on component 206 to the conductive material pattern 210. The solder 222 need not be all at one end of the cavity 218 as illustrated in FIG. 24, but may partly coat the bottom of cavity 218, or be otherwise placed. Thus, it is important that the second conductive material 222 be in physical and electrical contact with the first conductive material 220, at least after the reflow step. It is conceivable that solder 222 could be present only as a slug or portion on the floor of cavity 218 without touching any of the walls as long as upon reflow electrical connection is made.

The bonding achieved by solder 222 may be optionally facilitated by at least partially providing the component lead receiving cavity 218 with a coating or plating 226 of a conductive material, which may be the same or different as that 220 which fills grooves 212. This plating 226 will help assure the integrity of the electrical connection formed after the reflow step. Although plating 226 is shown on four sides of lead receiving cavity 218, it will be appreciated that plating 226 may be on fewer sides and will still be within the scope of this invention.

The circuit board 200 seen in FIG. 24 may be made using any of the procedures discussed previously, and an optional plating resist layer 228 may exist on mounting surfaces 204 and 208 from one of these methods. However, another technique will be described with reference to FIGS. 25 through 28, where similar reference numerals are used for similar features found in FIG. 24.

Figure 25:
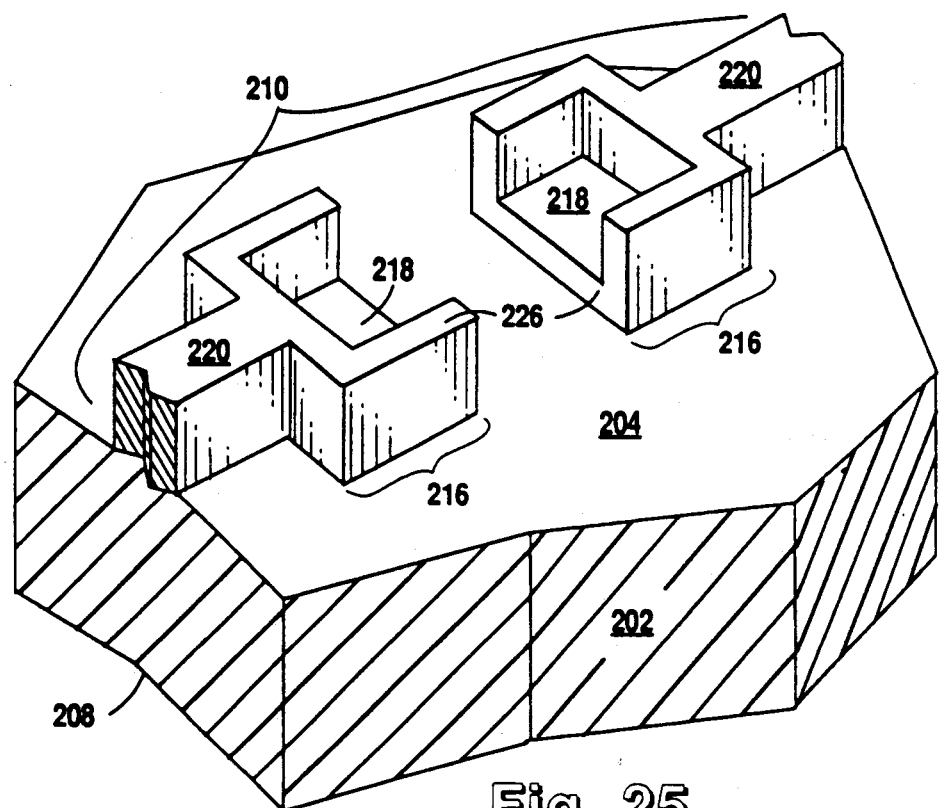

Shown in FIG. 25 is the conductive material pattern 210 formed upon the mounting surface 204 prior to imbedding therein. Note that the optional coating or plating layer 226 is shown to be generally thicker in this view than as depicted in FIG. 24.

It will be appreciated that the invention could be used in this form, after the reflowable material 222 is placed in the lead receiving cavities or "pockets" 218. However, it is also apparent that this may not be the best embodiment of the invention, since the pattern 210 would be exposed to a greater probability of physical damage on the surface, rather than imbedded within the surface. In certain situations, however, one skilled in the art may choose to leave a portion of pattern 210, such as the component lead contact regions 216 on the surface 210 rather than at least partially within the surface. For example, certain crucial component bonds may need to be visually inspected to a greater degree.

Figure 26:
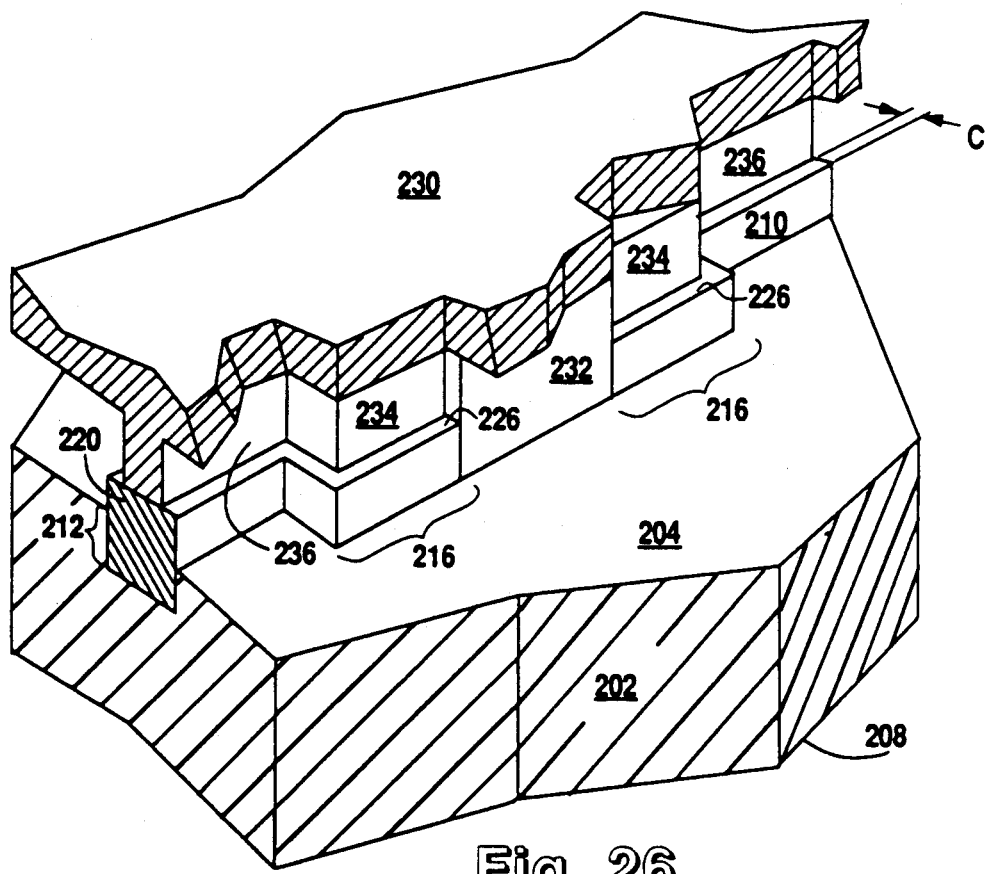

Shown in FIG. 26 is the structure of FIG. 25 as it might appear during the imbedding procedure. In this step, an impression pattern 230 is used to press conductive material pattern 210 into surface 204 in a thermocompression step. The substrate 202 should be a thermoplastic material that will yield and flow plastically when subjected to heat and under pressure. Note that pattern 210 is partially imbedded and that groove 212 is beginning to be formed by pattern 210 itself. The design of impression pattern 230 may take various forms. In general, it corresponds to the conductive material pattern 210. In FIG. 26, the impression pattern 230 has a component portion 232 that fills what will be recess 214 from side to side, and has side portions 234 and longitudinal portions 236 which partially span the areas of plating 226 (to be component lead contact region 216) and groove 212 portion of pattern 210. That is, there is a clearance c that will permit the thermoplastic substrate 202 material to override conductive material pattern 210 when the press is closed and the pattern 210 is completely imbedded. Clearance c thus gives a profile as shown on the left side of FIG. 27, where the pattern 210 is "sealed" in groove 212 and protected by the thermoplastic material. This sealing by the plastic substrate provides a more reliable circuit board 200.

Figure 27:
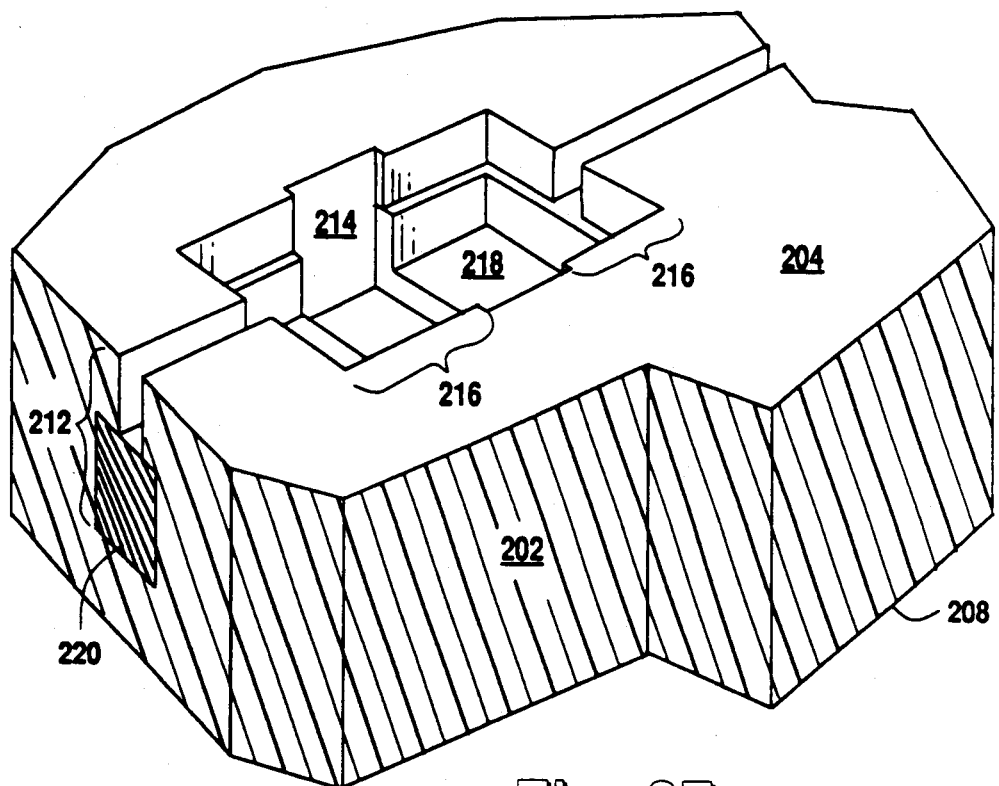

After substrate 202 has cooled and impression pattern 230 removed, the result is a structure as seen in FIG. 27. All that remains is the at least partial filling of component lead receiving cavities 218 with the second conductive material 222, which may be solder, to give the structure illustrated in FIG. 28. It will be appreciated that an alternate method for making the structure of this embodiment is to partially fill the cavities 218 with solder 222 before the imbedding step, such as in the structure shown in FIG. 25. If this alternate procedure is used, the temperature of the thermocompression imbedding step should be below that of the reflow temperature of material 222 so that the possible reflowing of material 222 will not occur. If a good seal between impression pattern 230 and conductive pattern 210 can be achieved to limit reflow of the material 222, then the thermocompression temperature could be above that of the reflow of material 222.

Figure 28:
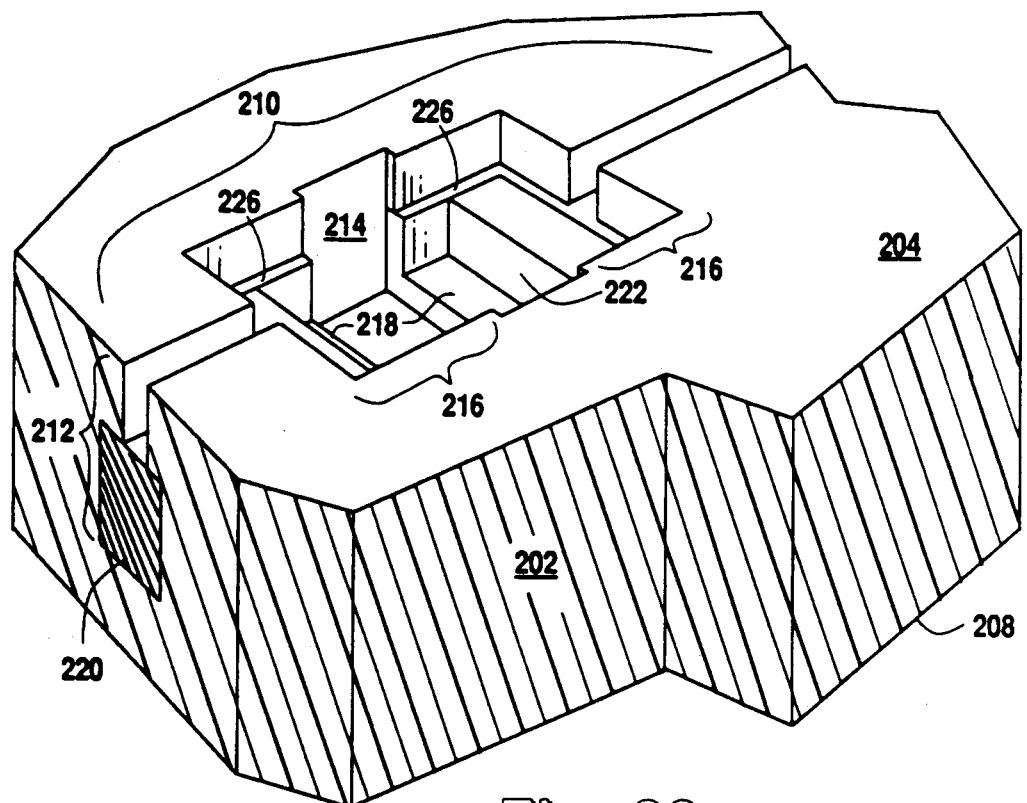

It will be appreciated that the version of FIG. 28 is somewhat different than that depicted in FIG. 24. It is within the scope of this embodiment that the conductive material pattern 210 may be below the mounting surface 204 as shown in FIG. 28, rather than within and having its top edge flush therewith, as seen in FIG. 24. The invention will perform even if the pattern 210 is only partially imbedded, that is, as if the imbedding process was stopped at FIG. 26. It would be expected that control over the reflowable material 222 would not be as great, however.

Mounting components 206 may be easily and conventionally mounted in circuit board 200 of FIGS. 24 or 28, by a procedure analogous to that previously described. The component 206 is placed into recess 214 such that connectors 224 are within the component lead contact region 216 and near or within component lead receiving cavity or "pocket" 218. The board 200 is then subjected to a thermal reflow step causing second conductive material 222 to flow and bond with connection 224, which upon cooling forms a reliable electrical connection between component 206 and conductive material pattern 210.

The solder core circuit boards of the present invention thus provide a number of advantages in the assembling of high density circuit boards for current applications. For example, the solder is contained within the cavities or "pockets" of the circuit board so that it is already present at the contact sites when the components are placed on the board for the bonding step. This "integrated solder" feature of the invention eliminates difficulties involved in delivering solder to increasingly small contact spaces in increasingly inaccessible areas. In fact, the invention makes possible the bonding of a lead underneath a component. For example, pin grid arrays (PGAs) are IC packages where the leads protrude from one large side of a relatively flat package body to give a "bed of nails" appearance. While such packages may be mounted with through-holes to insure that bonds are properly made to every pin, in other words, that solder is delivered to every pin from the underside of the board opposite the package, methods for surface mounting a PGA have been frustrated by trying to deliver solder to traces under the package. With the present invention, the traces themselves may deliver solder to the leads.

Other advantages of the invention include reduced circuit board assembly time and processing, assured board solderability, improved assembly manufacturing yields and fewer board fabrication process steps. Improved circuit density is achieved by using the z-axis for the interconnect traces. Additionally, both "surface mount" and "plated through-hole" technologies can be accommodated. Soldering may be accomplished by a single pass reflow thermal cycle, a well known art. No addition of solder in wave form or paste (screening) is required. The solder core circuit board invention also makes possible the assembly and soldering of very fine lead pitch surface mounted devices with automatic registration and no bridge solder joints. Additionally, in some embodiments, the solder core circuit board may have imbedded beneath the conductive material (solder) pattern a layer or pattern of a non-reflowable conductive material, such as copper.

Also, the invention may be used with conventional assembly equipment unlike many of the proposed assembly techniques for high density circuit boards. Furthermore, the invention provides a workable structure for the direct mounting of components with fragile leads, such as a TAB mounted IC, into a circuit board. It will be appreciated that various modifications may be made to the invention herein that are within the scope and spirit of the invention which are defined only by the appended claims. For example, one skilled in the art would understand that although the traces and grooves illustrated in the drawings and discussion herein have an aspect ratio greater than 1:1, that is, their height in the z-direction is greater than their width in either the x- or y-direction, that this does not prevent a solder core circuit board from having relatively shallow grooves or trenches. Some depth or dimension in the z-direction is required, of course, to insure that the solder will flow properly during the bonding step. The groove could also conceivably be a solder-filled hole within the substrate, or a solder column implanted or imbedded through the substrate.

I claim:

1. A circuit board for receiving electronic components comprising:
   an insulative substrate having at least one mounting surface; and
   a conductive material pattern positioned over the surface of the insulative substrate and at least partially within the mounting surface, the pattern comprising:
   a groove within the mounting surface; and
   a first conductive material at least partially filling the groove; and
   a component lead contact region in communication with the groove comprising a component lead receiving cavity; and a second conductive material at least partially filling the cavity; where the second conductive material is more readily reflowable than the first conductive material.

2. The circuit board of claim 1 where the insulative substrate is a thermoplastic material having a reflow point and the second conductive material has a reflow point and the reflow point of the thermoplastic material is higher than that of the second reflowable, conductive material.

3. The circuit board of claim 1 where the second conductive material is solder.

4. The circuit board of claim 1 where the groove has a depth into the mounting surface and a width, and where the depth is greater than the width.

5. The circuit board of claim 1 where at least part of the contact region is substantially free from the second conductive material.

6. The circuit board of claim 1 where the conductive material pattern further comprises a series of recesses for at least partially receiving electronic components, where the recesses communicate with at least one groove, and where the component lead contact region is within the recess.

7. The circuit board of claim 1 where the at least one mounting surface is a first mounting surface and the conductive material pattern thereon is a first conductive material pattern, and the insulative substrate has a second mounting surface on the opposite side of the substrate from the first mounting surface where the second mounting surface has a second conductive material pattern thereon.

8. The circuit board of claim 7 where the first conductive material pattern and the second conductive material pattern are electrically connected with one another.

9. The circuit board of claim 1 where the component lead receiving cavity is at least partially coated with the first conductive material.

10. The circuit board of claim 9 where at least part of the component lead receiving cavity is not covered by the second conductive material.

11. The circuit board of claim 1 where the first conductive material pattern is below the surface of the insulative substrate, and insulative substrate at least partially covers at least part of the first conductive material of said conductive material pattern.

12. A circuit board for receiving electronic components comprising:
an insulative substrate having at least one mounting surface; and
a conductive material pattern positioned over the surface of the insulative substrate and at least partially within the mounting surface, the pattern comprising:
a groove within the mounting surface;
a recess in communication with the groove; and
a first conductive material at least partially filling the groove; and
a component lead contact region in the recess, where the contact region further comprises
a component lead receiving cavity; and a second conductive material at least partially filling the cavity;
where the second conductive material is in physical and electrical contact with part of the conductive material pattern, and the second conductive material is more readily reflowable than the first conductive material, where the insulative substrate has a reflow point and the second conductive material has a reflow point, and the reflow point of the insulative substrate is higher than that of the second reflowable, conductive material.

13. The circuit board of claim 12 where the first conductive material is copper and the second conductive material is solder.

14. The circuit board of claim 12 where the component lead receiving cavity is coated with the first conductive material, which is at least partially covered by the second conductive material.

15. The circuit board of claim 12 where the first conductive material pattern is below the surface of the insulative substrate, and insulative substrate at least partially covers at least part of the first conductive material of said conductive material pattern.

16. An assembled electronic solder core circuit board bearing electronic components comprising:
a circuit board for receiving electronic components comprising:
an insulative substrate having at least one mounting surface; and
a conductive material pattern positioned over the surface of the insulative substrate and at least partially within the mounting surface, the pattern comprising:
a plurality of grooves within the mounting surface;
a first conductive material at least partially filling the grooves; and
component lead contact regions, each region having a lead receiving cavity at least partially filled with a second conductive material that is reflowable, where the first conductive material and the second conductive material are in electrical contact with each other;
an electronic component having leads on the circuit board where the leads are bonded to the conductive material pattern by the second conductive material within the lead receiving cavity.

17. The assembled electronic solder core circuit board of claim 16 where the grooves have a width and a depth, and the depth is greater than the width.

18. The assembled electronic solder core circuit board of claim 16 where the component lead contact region is plated with a third conductive material that is present between the contact region and the second conductive material which at least partially fills the remainder of the cavity not occupied by the plating.

19. The circuit board of claim 16 where the first conductive material pattern is below the surface of the insulative substrate, and insulative substrate at least partially covers a width of at least part of a length of the first conductive material of said conductive material pattern.

* * * * *